United States Patent
Chida

(10) Patent No.: US 8,936,952 B2
(45) Date of Patent: Jan. 20, 2015

(54) METHOD FOR MANUFACTURING SEMICONDUCTOR DEVICE

(75) Inventor: Akihiro Chida, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 68 days.

(21) Appl. No.: 13/155,475

(22) Filed: Jun. 8, 2011

(65) Prior Publication Data

US 2011/0318889 A1    Dec. 29, 2011

(30) Foreign Application Priority Data

Jun. 25, 2010   (JP) ................ 2010-145427

(51) Int. Cl.
*H01L 21/02*     (2006.01)
*H01L 27/12*     (2006.01)

(52) U.S. Cl.
CPC ...... *H01L 27/1266* (2013.01); *H01L 21/02554* (2013.01); *H01L 21/02631* (2013.01); *H01L 2227/323* (2013.01); *H01L 21/02565* (2013.01); *H01L 27/1225* (2013.01); *H01L 2227/326* (2013.01)
USPC ................. 438/25; 438/158; 438/27; 438/29; 438/33; 438/59; 438/68; 438/70; 438/458; 438/464

(58) Field of Classification Search
CPC ...................... H01L 2227/32; H01L 29/66765
USPC .............. 438/158, 479; 257/E21.09, E21.411
See application file for complete search history.

(56) References Cited

U.S. PATENT DOCUMENTS

| | | |
|---|---|---|
| 5,764,320 A | 6/1998 | Konuma et al. |
| 5,982,471 A | 11/1999 | Hirakata et al. |
| 5,995,189 A | 11/1999 | Zhang et al. |
| 6,013,542 A | 1/2000 | Yamazaki et al. |
| 6,239,850 B1 | 5/2001 | Ohori et al. |
| 6,246,454 B1 | 6/2001 | Koyama et al. |
| 6,411,351 B1 | 6/2002 | Zhang et al. |
| 7,038,377 B2 | 5/2006 | Kobayashi et al. |
| 7,190,116 B2 | 3/2007 | Kobayashi et al. |
| 7,688,290 B2 | 3/2010 | Yamazaki et al. |
| RE42,215 E | 3/2011 | Kobayashi et al. |
| 7,902,751 B2 | 3/2011 | Hayashi |

(Continued)

FOREIGN PATENT DOCUMENTS

| | | |
|---|---|---|
| EP | 1450334 A | 8/2004 |
| EP | 0 858 110 | 12/2006 |

(Continued)

*Primary Examiner* — Olik Chaudhuri
*Assistant Examiner* — Christine Enad
(74) *Attorney, Agent, or Firm* — Eric J. Robinson; Robinson Intellectual Property Law Office, P.C.

(57) ABSTRACT

An object is to provide a manufacturing method of a semiconductor device in which a defect in characteristics due to a crack occurring in a semiconductor device is reduced. Provision of a crack suppression layer formed of a metal film in the periphery of a semiconductor element makes it possible to suppress a crack occurring from the outer periphery of a substrate and reduce damage to the semiconductor element. In addition, even if the semiconductor device is subjected to physical forces from the outer periphery in separation and transposition steps, progression (growth) of a crack to the semiconductor device can be suppressed by the crack suppression layer.

7 Claims, 16 Drawing Sheets

(56) References Cited

U.S. PATENT DOCUMENTS

| | | |
|---|---|---|
| RE43,738 E | 10/2012 | Kobayashi et al. |
| 8,324,805 B2 | 12/2012 | Hayashi |
| RE44,902 E | 5/2014 | Kobayashi et al. |
| 2001/0053560 A1* | 12/2001 | Shinohara et al. ............... 438/98 |
| 2003/0032210 A1 | 2/2003 | Takayama et al. |
| 2007/0211189 A1* | 9/2007 | Yamazaki et al. ............... 349/45 |
| 2007/0241664 A1* | 10/2007 | Sakamoto et al. ............ 313/503 |
| 2008/0135848 A1* | 6/2008 | Yamazaki et al. ............... 257/66 |
| 2009/0039349 A1* | 2/2009 | Honda ........................... 257/59 |
| 2009/0090940 A1 | 4/2009 | Tsurume et al. |

FOREIGN PATENT DOCUMENTS

| | | |
|---|---|---|
| EP | 1 351 308 | 4/2009 |
| EP | 1 744 365 | 4/2009 |
| JP | 10-125931 | 5/1998 |
| JP | 2003-174153 | 6/2003 |
| JP | 2009-117079 A | 5/2009 |
| JP | 2009-117688 A | 5/2009 |
| WO | WO-2003/060858 | 7/2003 |

* cited by examiner

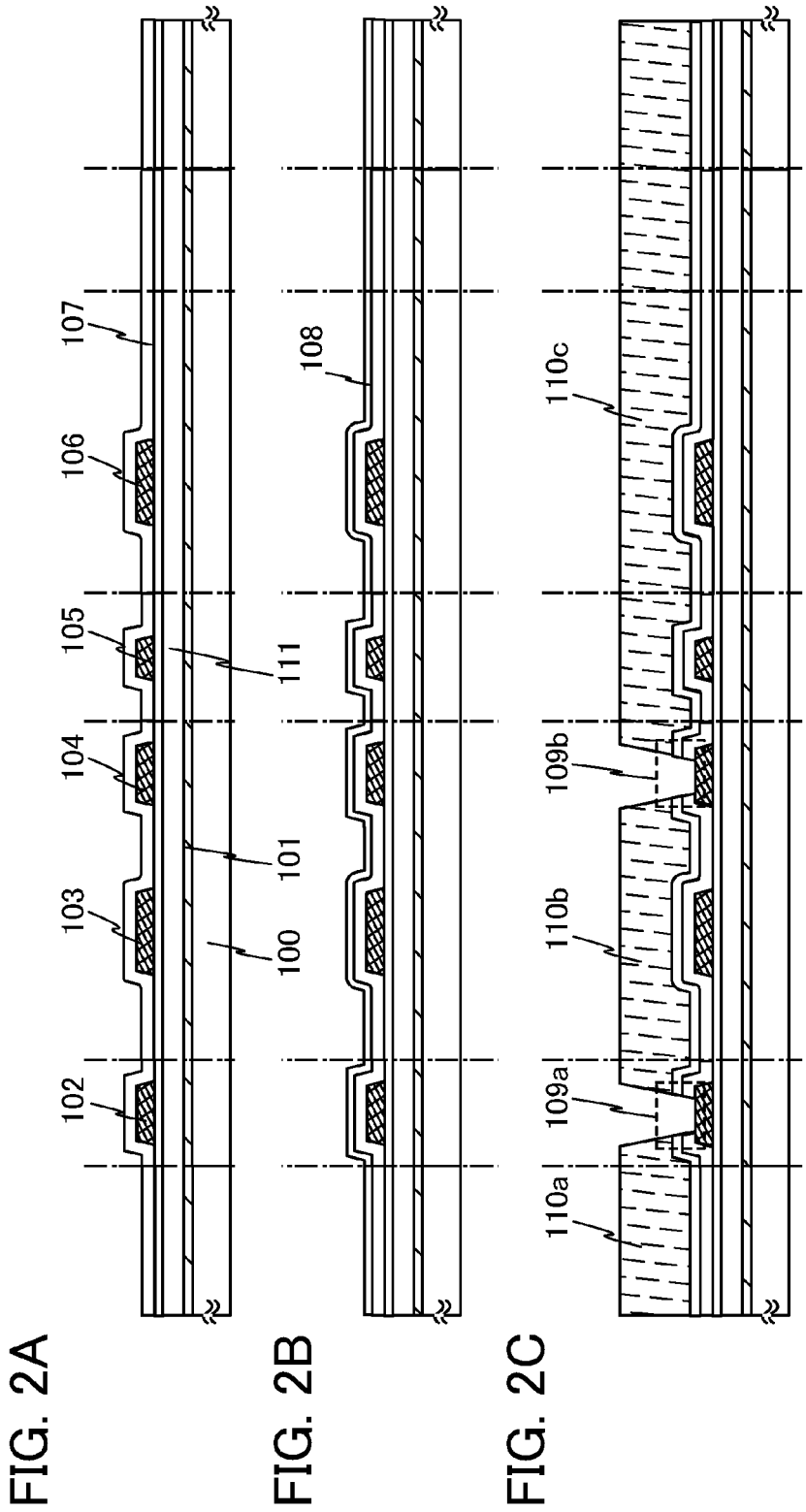

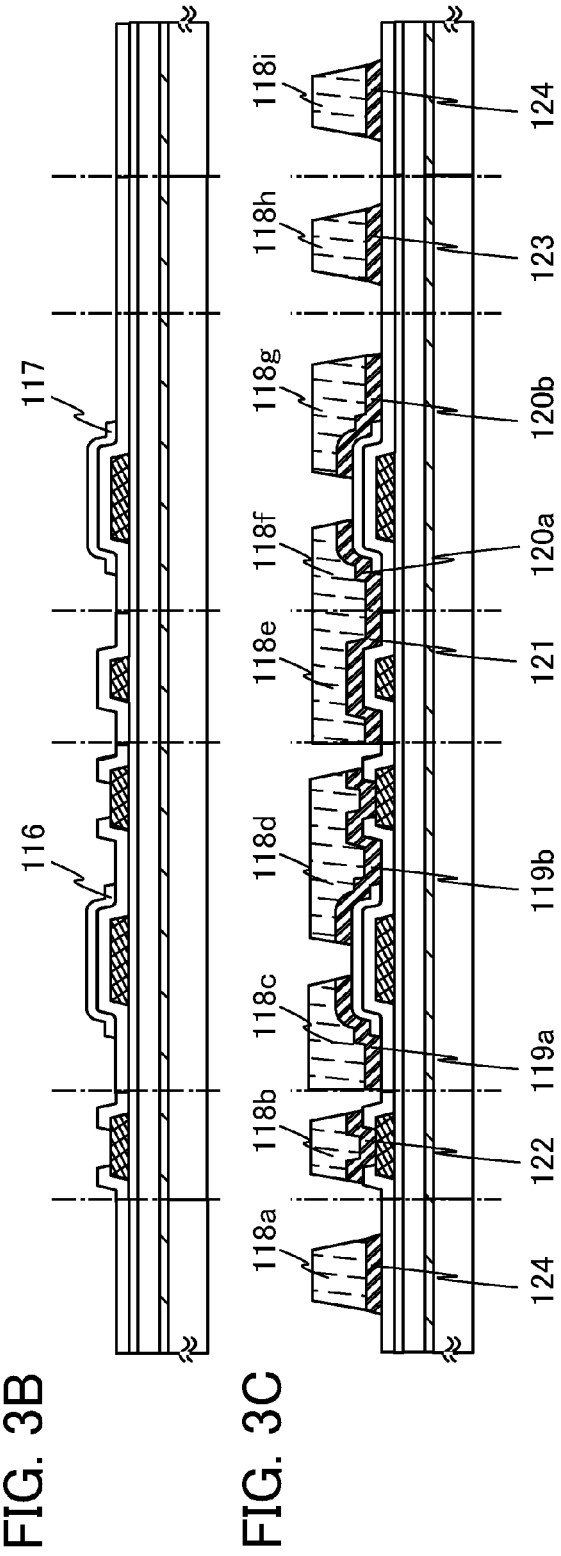

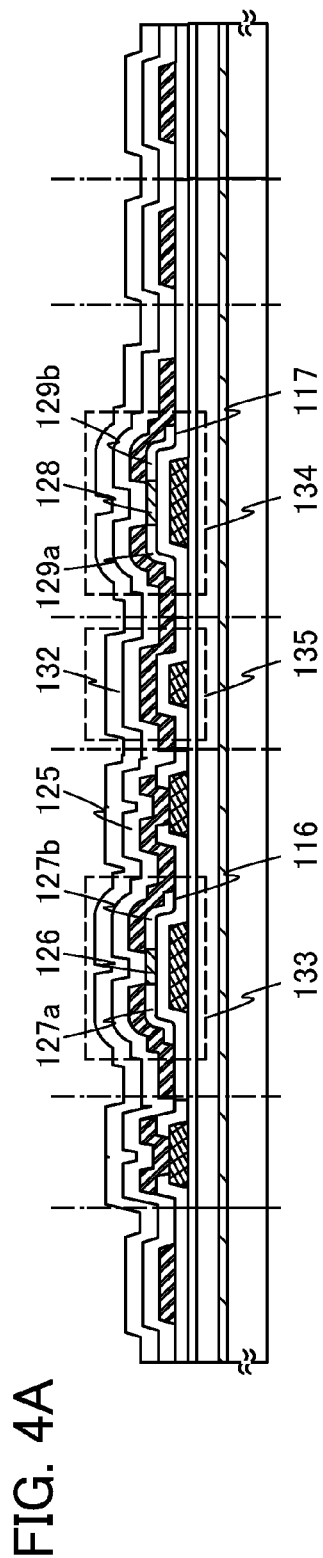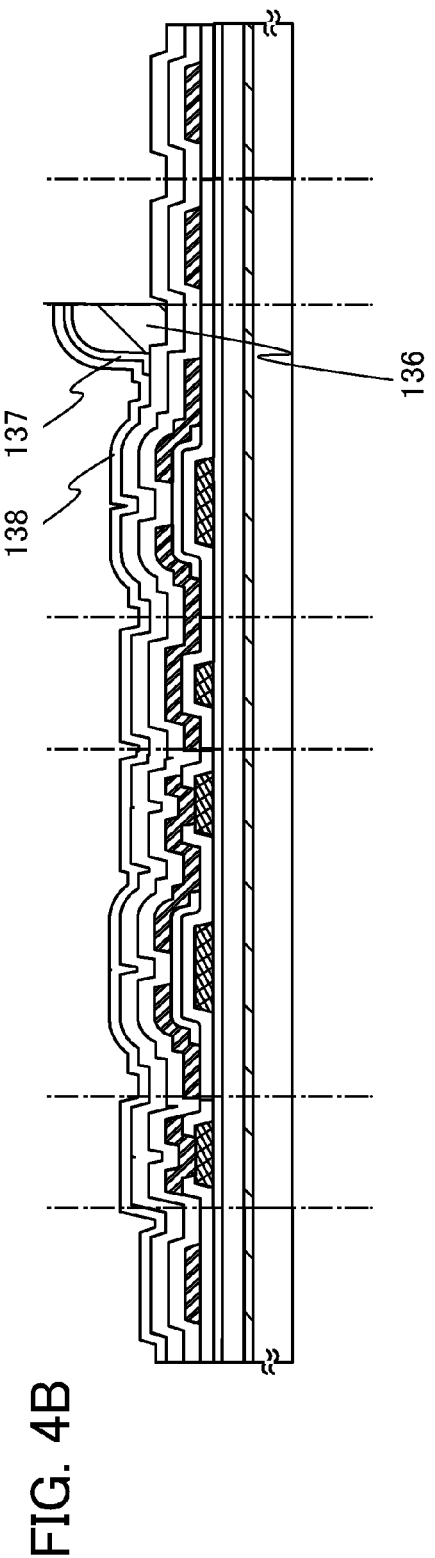
FIG. 4A
FIG. 4B

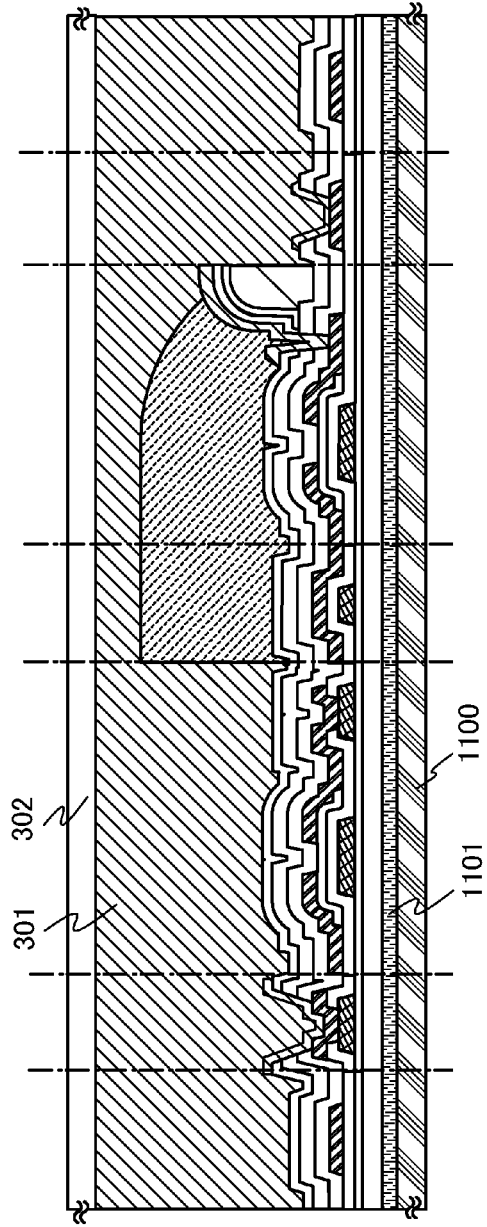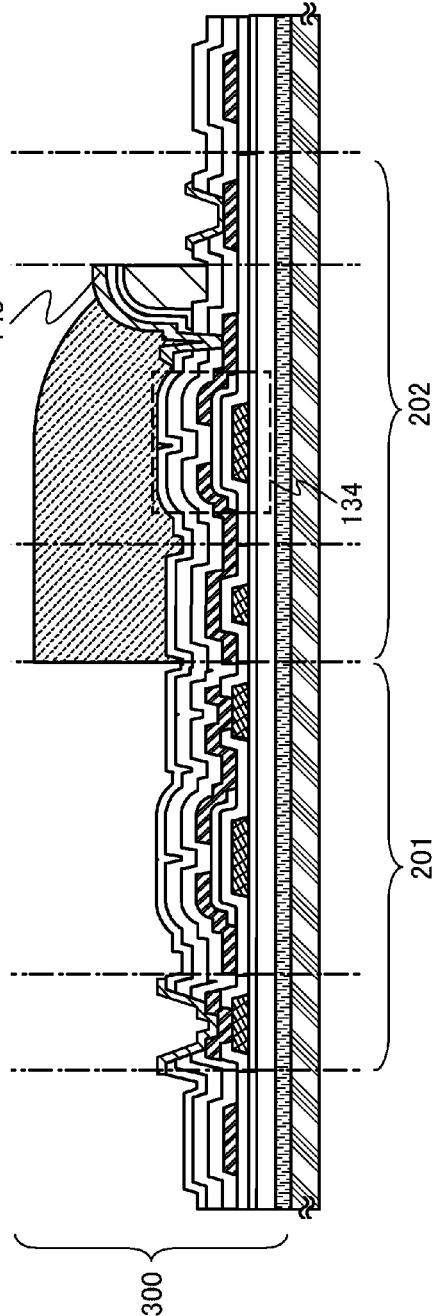

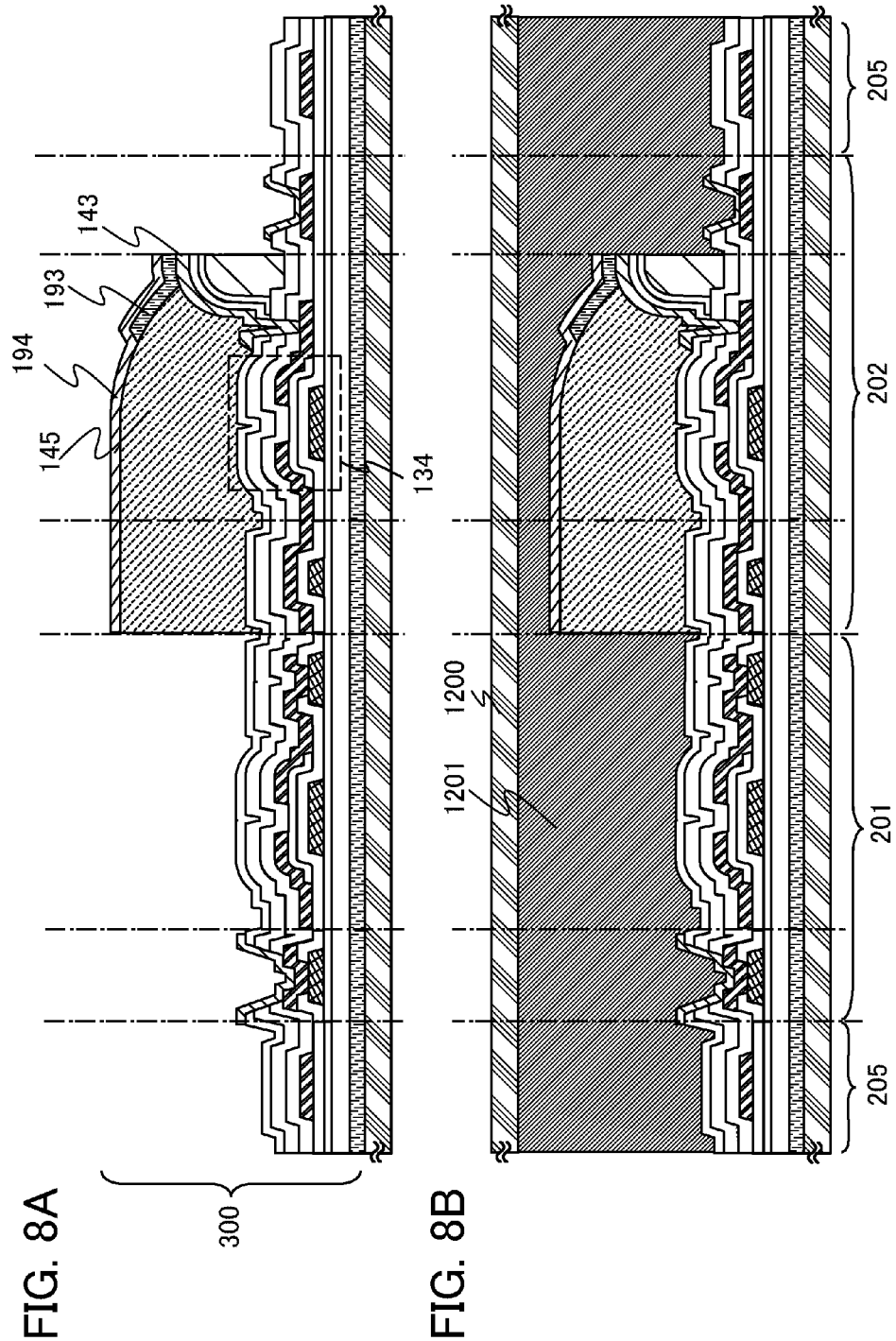

701  702 703 704

704a  704b  705

707
708
706b  706c
706a

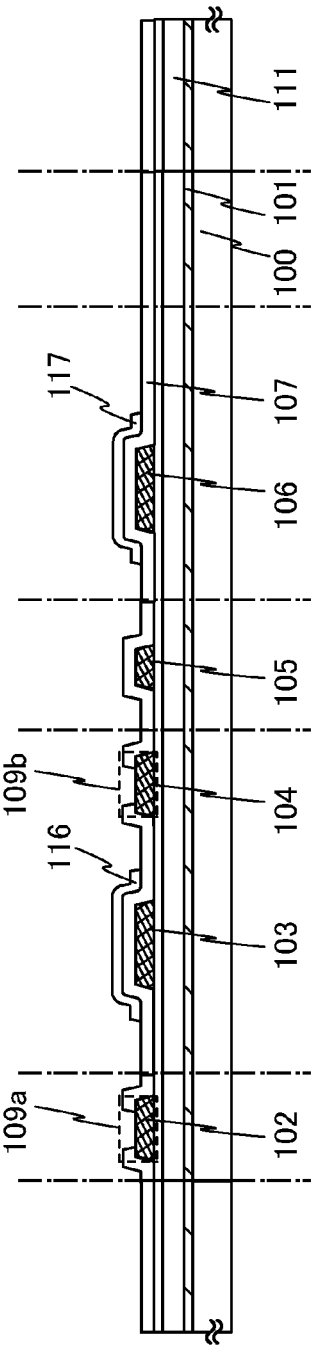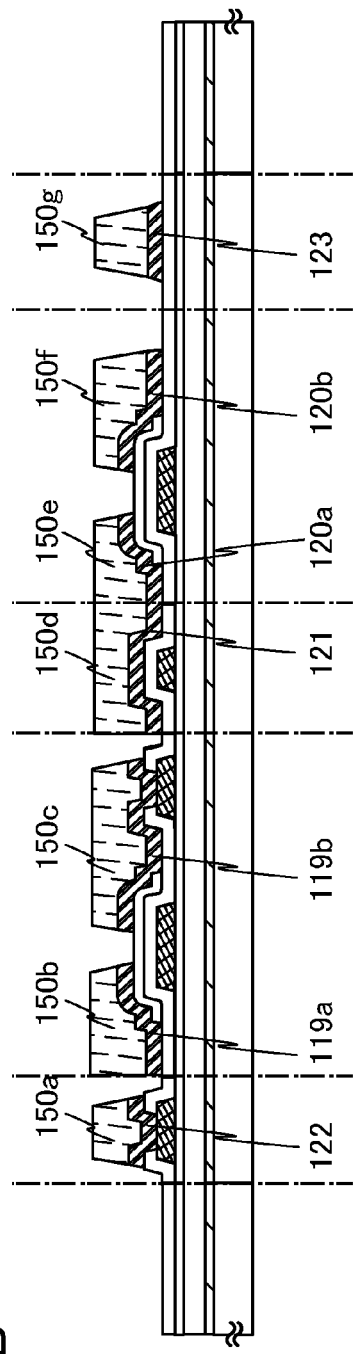
FIG. 14A
FIG. 14B

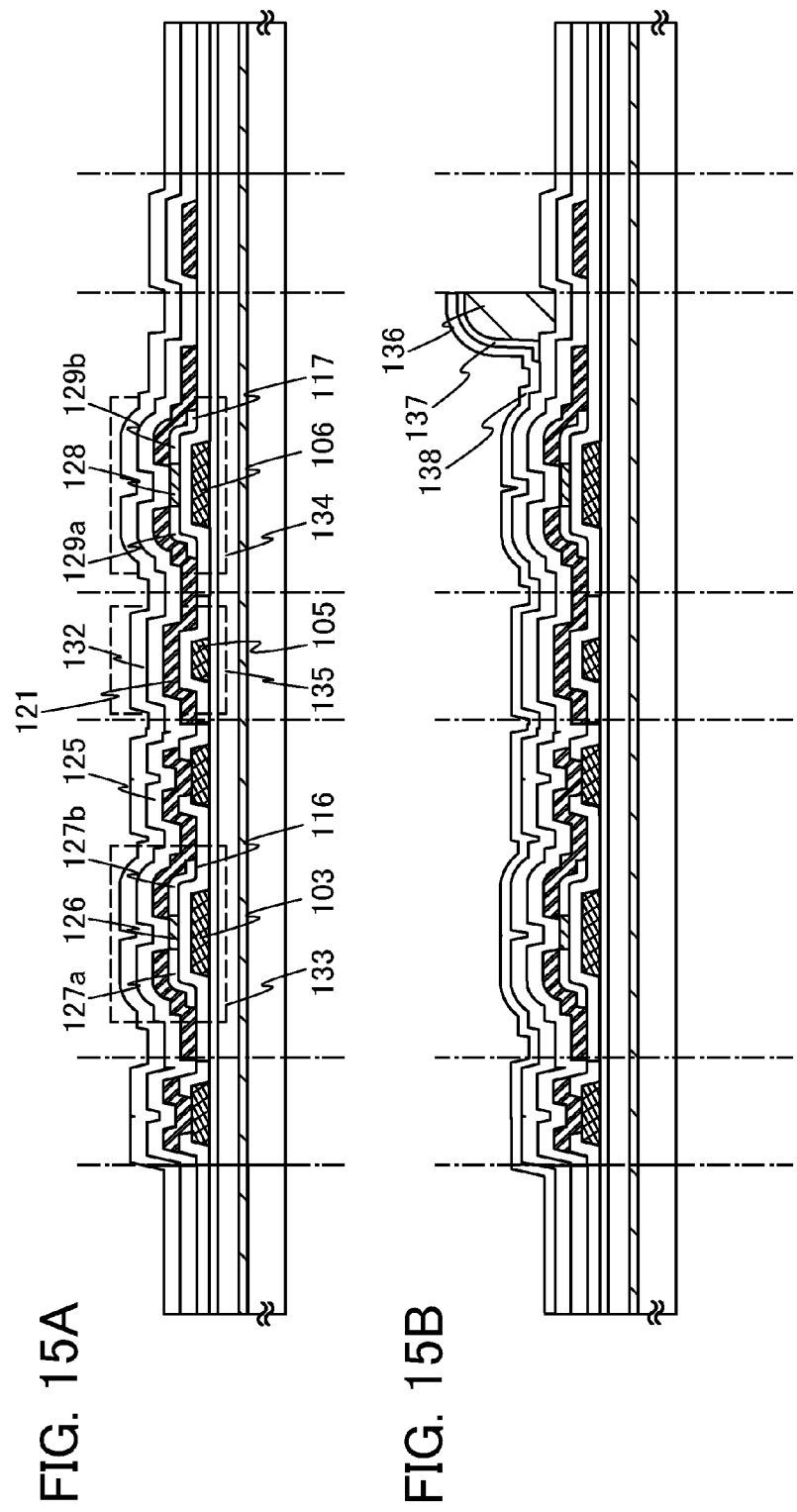

METHOD FOR MANUFACTURING SEMICONDUCTOR DEVICE

BACKGROUND OF THE INVENTION

1. Field of the Invention

The present invention relates to a method for manufacturing a semiconductor device.

Note that in this specification, the term "semiconductor device" refers to general devices that can function by utilizing semiconductor properties, and substrates over which semiconductor elements such as thin film transistors (TFTs) are formed, liquid crystal display devices driven using TFTs, electroluminescence (EL) display devices driven using TFTs, semiconductor circuits, and electronic devices are all defined as semiconductor devices.

2. Description of the Related Art

In recent years, techniques of manufacturing semiconductor devices have been greatly improved: flexible substrates are capable of reducing size and weight of semiconductor devices, and further achieving flexibility and impact resistance of semiconductor devices, and thus, are considered to be used for semiconductor devices.

As a method for manufacturing a flexible semiconductor device, a technique in which a semiconductor element such as a thin film transistor is formed over a base substrate such as a glass substrate or a quartz substrate, and then the semiconductor element is transferred from the base substrate to another base material (for example, a flexible base material) has been developed. In order to transfer the semiconductor element to another base material, a step for separating the semiconductor element from the base material that is used in forming the semiconductor element is necessary.

For example, Patent Document 1 discloses a separation technique using laser ablation, which is described below. A separation layer formed of amorphous silicon or the like is formed over a substrate, a layer to be separated which is formed of a thin film element is formed over the separation layer, and the layer to be separated is bonded to an object to which the layer is transferred, by an adhesive layer. The separation layer is ablated by laser light irradiation, so that separation is generated at the separation layer.

In addition, Patent Document 2 discloses a technique in which separation is conducted by physical force such as human hands. In Patent Document 2, a metal layer is formed between a substrate and an oxide layer and separation is generated at the interface between the oxide layer and the metal layer by utilizing weak bonding at the interface between the oxide layer and the metal layer, so that a layer to be separated and the substrate are separated from each other.

In the case where separation is conducted by physical force such as human hands, a layer to be separated needs to be curved in order to separate the layer from a base material along a separation layer. The layer to be separated formed in contact with the separation layer is a very fragile thin film with a thickness of about 10 μm in which semiconductor elements including a thin film transistor (TFT), a wiring, an interlayer film, and the like are formed. When the bending stress is applied to the semiconductor elements, breaking or a crack easily occurs in the layer to be separated, which causes malfunctions such as breaking of the semiconductor devices.

A crack caused in a separation step tends to occur from the periphery of a substrate. When the crack occurs, the crack progresses (grows) from the periphery of the substrate to the inside of the substrate as time passes due to stress put on a resin, a film, and the like.

REFERENCE

Patent Document

[Patent Document 1] Japanese Published Patent Application No. H10-125931
[Patent Document 2] Japanese Published Patent Application No. 2003-174153

SUMMARY OF THE INVENTION

It is an object of the present invention to provide a method for manufacturing a semiconductor device in which a defect in characteristics due to a crack in the semiconductor device is reduced.

It is another object of the present invention to provide a method for manufacturing a semiconductor device in which a defect in characteristics due to a crack occurring when a semiconductor element is separated from a substrate (that is, in a separation step) and a crack occurring when the semiconductor element is transferred to a flexible substrate is reduced.

An embodiment of a structure of the invention disclosed in this specification is a method for manufacturing a semiconductor device including the steps of: forming a separation layer over a first substrate; forming a buffer layer over the separation layer; forming a semiconductor element including a transistor over the buffer layer; and forming a crack suppression layer in the periphery of the semiconductor element.

Another embodiment of a structure of the invention disclosed in this specification is a method for manufacturing a semiconductor device including the steps of: forming a separation layer over a first substrate; forming a buffer layer over the separation layer; forming a semiconductor element including a transistor over the buffer layer; and forming a crack suppression layer formed of a metal film in the periphery of the semiconductor element. The transistor includes a gate electrode layer, a source electrode layer, and a drain electrode layer. The crack suppression layer formed of a metal film is formed in the same step as at least one of the gate electrode layer, the source electrode layer, and the drain electrode layer.

Another embodiment of a structure of the invention disclosed in this specification is a method for manufacturing a semiconductor device including the steps of: forming a separation layer over a first substrate; forming a buffer layer over the separation layer; forming a semiconductor element including a transistor over the buffer layer; and forming a crack suppression layer formed of a metal film in the periphery of the semiconductor element. The transistor includes a gate electrode layer, a source electrode layer, and a drain electrode layer. The crack suppression layer formed of a metal film is formed in the same step as at least one of the gate electrode layer, the source electrode layer, and the drain electrode layer. The first substrate and the semiconductor element are separated from each other along the separation layer.

Another embodiment of a structure of the invention disclosed in this specification is a method for manufacturing a semiconductor device including the steps of: forming a separation layer over a first substrate; forming a buffer layer over the separation layer; forming a semiconductor element including a transistor over the buffer layer; and forming a crack suppression layer formed of a resin film in the periphery of the semiconductor element. The transistor includes a gate electrode layer, a source electrode layer, a drain electrode layer, an insulating layer, a protective insulating layer, and a partition. The crack suppression layer formed of a resin film is formed using the same material as at least one of the insulating layer, the protective insulating layer, and the partition. The first substrate and the semiconductor element are separated from each other along the separation layer.

In the above structure of the method for manufacturing a semiconductor device, the crack suppression layer formed of a metal film is formed using a film containing an element selected from aluminum, chromium, tantalum, titanium, molybdenum, tungsten, silver, copper, gold, platinum, nickel, or palladium as its main component, an alloy film of any of the elements, a stacked film of any of the elements, or a stacked film of a film containing any of the elements as its main component and the alloy film.

In the above structure of the method for manufacturing a semiconductor device, the crack suppression layer formed of a resin film is formed using a material selected from an organic resin film of polyimide, acrylic, polyamide, or epoxy, an inorganic insulating film, or a siloxane-based resin, or a stacked film thereof.

In the above structure of the method for manufacturing a semiconductor device, the crack suppression layer formed of a metal film has a thickness of greater than or equal to 300 nm and less than or equal to 5000 nm.

In the above structure of the method for manufacturing a semiconductor device, the crack suppression layer formed of a resin film has a thickness of greater than or equal to 700 nm and less than or equal to 20000 nm.

In the above structure of the method for manufacturing a semiconductor device, the crack suppression layer formed of a metal film and the crack suppression layer formed of a resin film each have a width of greater than or equal to 100 μm and less than or equal to 10000 μm.

In the above structure of the method for manufacturing a semiconductor device, the crack suppression layer formed of a metal film is electrically connected to a transistor.

The peripheries of regions where desired semiconductor elements are formed are to be spaces when the semiconductor elements are separated individually later; thus, cracks occurring in those regions do not adversely affect the yield.

Since a transistor is easily broken due to static electricity or the like, a protective circuit for protecting the transistor in a pixel portion is preferably provided over the same substrate as the transistor. The protective circuit is preferably formed using a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names for specifying the present invention.

According to one embodiment of the present invention, formation of a crack suppression layer formed of a metal film or a crack suppression layer formed of a resin film makes it possible to suppress a crack occurring in a semiconductor element when the semiconductor element is separated from a substrate. Thus, yield in manufacturing the semiconductor element can be improved.

According to one embodiment of the present invention, a crack suppression layer formed of a metal film can be formed using the same material as at least one of a gate electrode layer, a source electrode layer, and a drain electrode layer of a semiconductor element, so that the crack suppression layer formed of a metal film can be easily formed without increasing the number of manufacturing steps.

According to one embodiment of the present invention, a crack suppression layer formed of a resin film can be formed using the same material as at least one of an insulating layer, a protective insulating layer, and a partition of a semiconductor element, so that the crack suppression layer formed of a resin film can be easily formed without increasing the number of manufacturing steps.

According to one embodiment of the present invention, a crack caused in a separation step tends to occur from the periphery of a substrate, and also tends to occur in a resin film having a low mechanical strength. Thus, with a metal film having a high mechanical strength, a crack can be suppressed. A crack occurs and grows in a resin film which is formed continuously over a plane; however, if a resin film is formed discontinuously and has a higher mechanical strength than the resin film in which the crack occurs, a crack can be suppressed.

Therefore, even in a situation where occurrence of a crack in a separation step is unavoidable, if a crack suppression layer formed of a metal film or a crack suppression layer formed of a resin film is formed in the periphery of a desired semiconductor element, progression (growth) of a crack can be suppressed by the crack suppression layer, so that yield in manufacturing a semiconductor element can be improved.

BRIEF DESCRIPTION OF THE DRAWINGS

In the accompanying drawings:

FIGS. 2A to 2C are diagrams showing an embodiment of a method for manufacturing the semiconductor device;

FIGS. 3A to 3C are diagrams showing an embodiment of a method for manufacturing the semiconductor device;

FIGS. 4A and 4B are diagrams showing an embodiment of a method for manufacturing the semiconductor device;

FIGS. 7A and 7B are diagrams showing an embodiment of a method for manufacturing the semiconductor device;

FIGS. 8A and 8B are diagrams showing an embodiment of a method for manufacturing the semiconductor device;

FIGS. 14A and 14B are diagrams showing an embodiment of a method for manufacturing the semiconductor device;

FIGS. 15A and 15B are diagrams showing an embodiment of a method for manufacturing the semiconductor device.

DETAILED DESCRIPTION OF THE INVENTION

Embodiments of the present invention will be described in detail with reference to the accompanying drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Embodiment 1

In this embodiment, a manufacturing process of a semiconductor device will be described with reference to FIGS. 1A and 1B, FIGS. 2A to 2C, FIGS. 3A to 3C, FIGS. 4A and 4B, FIGS. 5A and 5B, FIG. 6, FIGS. 7A and 7B, FIGS. 8A and 8B, and FIG. 9.

Figure 1A:
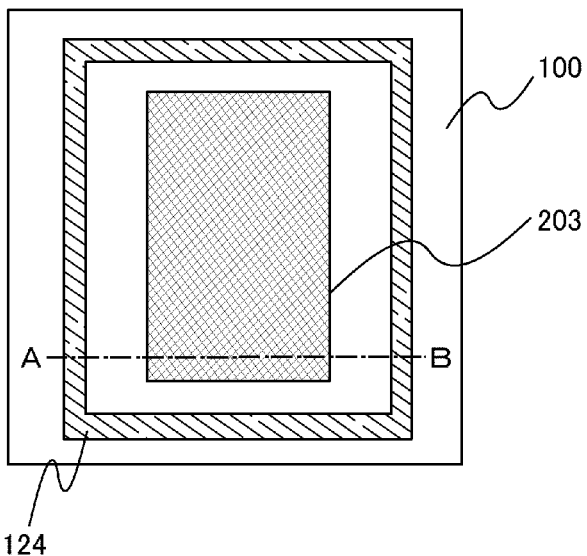
FIGS. 1A and 1B are diagrams showing an embodiment of a semiconductor device.
Figure 1B:
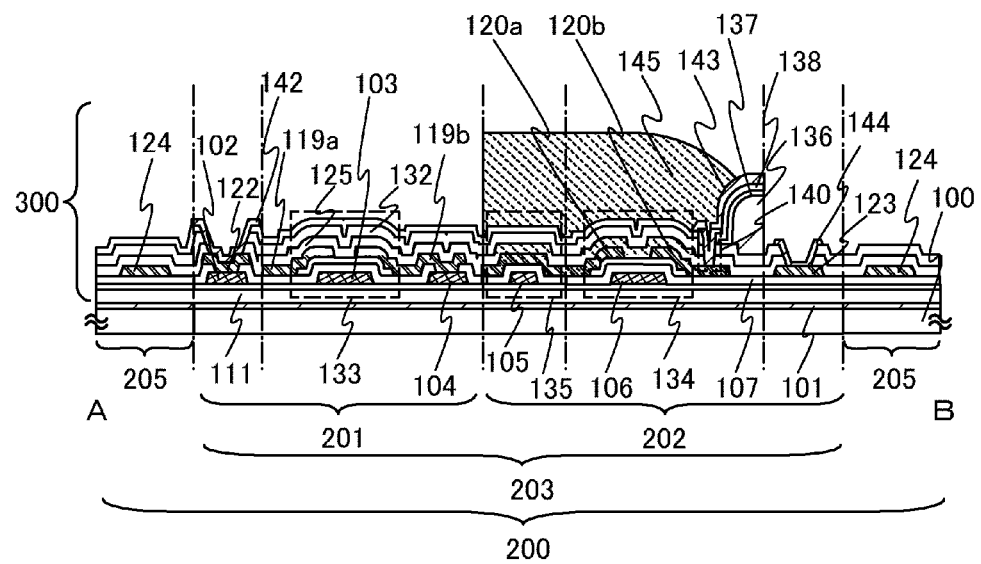

FIG. 1A is a planar view of a semiconductor device, and FIG. 1B is a cross-sectional view along a dashed line A-B in FIG. 1A. Note that FIGS. 1A and 1B are a planar view and a cross-sectional view showing a state where a manufacturing process of a semiconductor element is completed and before the semiconductor element is separated from a first substrate.

A semiconductor device 200 in FIGS. 1A and 1B includes a separation layer 101 over a first substrate 100, a first insulating layer 111 over the separation layer 101, a transistor 134 included in a pixel circuit portion 202 and a transistor 133 included in a driver circuit portion 201 over the first insulating layer 111, and a crack suppression region 205 including a crack suppression layer 124 formed of a metal film outside of the driver circuit portion 201 and the pixel circuit portion 202. Further, an insulating layer 125 is formed in the transistor 134 and the transistor 133, and a protective insulating layer 132 is formed over the insulating layer 125. A semiconductor element 203 comprises the driver circuit portion 201 and the pixel circuit portion 202.

In the pixel circuit portion 202, a color filter layer 136 is formed over the protective insulating layer 132. The color filter layer 136 is covered with an overcoat layer 137 and a protective insulating layer 138. A first electrode layer 143 is electrically connected to a source electrode layer 120a or a drain electrode layer 120b through a contact hole 140. Further, a partition 145 separating light-emitting elements is formed over the transistor 134. A capacitor 135 including a capacitor wiring layer 105 and a gate insulating layer 107 is formed in the pixel circuit portion 202. A second terminal 123 and a terminal electrode 144 are electrically connected to each other.

In the driver circuit portion 201, a source electrode layer 119a and a drain electrode layer 119b are formed in the transistor 133. The drain electrode layer 119b is electrically connected to a conductive layer 104. A first terminal 102 is formed by the same step as the gate electrode layer 103. The first terminal 102 is electrically connected to a terminal electrode 142 through a connection electrode 122 that is formed by the same step as the source electrode layer 119a and the drain electrode layer 119b.

For the transistors in this embodiment (that is, the transistor 133 included in the driver circuit portion and the transistor 134 included in the pixel circuit portion), an inverted-staggered transistor with a bottom-gate structure is used. The transistor 133 included in the driver circuit portion and the transistor 134 included in the pixel circuit portion are channel-etched transistors in each of which an oxide semiconductor layer is formed to be exposed between the source electrode layer and the drain electrode layer.

There is no particular limitation on the structure of the transistors (that is, the transistor 133 included in the driver circuit portion and the transistor 134 included in the pixel circuit portion). For example, a staggered transistor or a planar transistor having a top-gate structure or a bottom-gate structure can be employed. The transistors may have a single-gate structure in which one channel formation region is formed, a double-gate structure in which two channel formation regions are formed, or a triple-gate structure in which three channel formation regions are formed. Alternatively, the transistors may have a dual-gate structure including two gate electrode layers positioned over and below a channel region with a gate insulating layer provided therebetween.

Although a channel-etched transistor is used for description in this embodiment, the present invention is not limited thereto: a channel-protective type (also referred to as a channel-stop type) or the like can be used as appropriate.

In the crack suppression region 205 shown in FIG. 1B, the crack suppression layer 124 is formed by the same step as the source electrode layer 119a and the drain electrode layer 119b of the transistor 133 and the source electrode layer 120a and the drain electrode layer 120b of the transistor 134. The crack suppression layer 124 has a single-layer structure in this embodiment. However, a metal film may be formed in the crack suppression region 205 in a gate electrode step, that is, in a step of forming the gate electrode layer 103 and the gate electrode layer 106 so that the crack suppression layer 124 has a stacked-layer structure of the metal films which are formed in the steps different from each other. A gate insulating layer 107 and the like may be formed between the stacked metal films.

Note that according to the cross-sectional view of FIG. 1B, the width of each of the transistor 134 and the transistor 133 is about greater than or equal to 10 μm and less than or equal to 100 μm, while the width of each of the crack suppression layers is about greater than or equal to 100 μm and less than or equal to 10000 μm: the width difference therebetween is more than 10 times; however, the actual scale is different from the drawing.

Here, an example of a manufacturing method of the semiconductor device 200 in FIG. 1B will be described in detail with reference to FIGS. 2A to 2C, FIGS. 3A to 3C, FIGS. 4A and 4B, and FIGS. 5A and 5B. In the structures described below, the same portions or portions having similar functions are denoted by the same reference numerals in different drawings, and the description thereof will not be repeated.

The separation layer 101 is formed over the first substrate 100 and the first insulating layer 111 is formed over the separation layer 101. Preferably, the first insulating layer 111 is successively formed without exposing the formed separation layer 101 to the air. This successive formation prevents dust or impurities from entering the interface between the separation layer 101 and the first insulating layer 111 (see FIG. 2A).

For the first substrate 100, a glass substrate, a quartz substrate, a sapphire substrate, a ceramic substrate, a metal substrate, or the like can be used. In the manufacturing process of the semiconductor device, a manufacturing substrate can be selected as appropriate in accordance with the process.

In the case where a glass substrate is used and the temperature at which heat treatment to be performed later is high, a glass substrate whose strain point is higher than or equal to 730° C. is preferably used. For a glass substrate, a glass material such as aluminosilicate glass, aluminoborosilicate glass, or barium borosilicate glass is used, for example. Note that by containing a large amount of barium oxide (BaO), a glass substrate which is heat-resistant and more practical can be obtained. Alternatively, crystallized glass or the like may be used.

Note that the separation layer 101 is formed over the entire surface of the first substrate 100 in this step; however, after the separation layer 101 is formed over the entire surface of the first substrate 100, the separation layer 101 may be selectively removed as necessary so that the separation layer can be provided only in a desired region.

In FIGS. 2A to 2C, the separation layer 101 is formed in contact with the first substrate 100; however, when a glass substrate is used for the first substrate 100, it is further preferable to form an insulating layer such as a silicon oxide film, a silicon oxynitride film, a silicon nitride film, a silicon nitride oxide film between the first substrate 100 and the separation layer 101 because the formation of the insulating layer leads to prevention of contamination from the glass substrate.

The separation layer 101 has a single-layer structure or a stacked-layer structure containing an element selected from tungsten, molybdenum, titanium, tantalum, niobium, nickel, cobalt, zirconium, ruthenium, rhodium, palladium, osmium, iridium, or silicon; an alloy material containing any of the elements; or a compound material containing any of the elements. A crystalline structure of a layer containing silicon may be any one of an amorphous structure, a microcrystalline structure, and a polycrystalline structure.

The separation layer 101 can be formed by a sputtering method, a plasma CVD method, a coating method, a printing method, or the like. Note that the coating method includes a spin coating method, a droplet discharge method, and a dispensing method.

When the separation layer 101 has a single-layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 101 has a stacked-layer structure, a tungsten layer, a molybdenum layer, or a layer containing a mixture of tungsten and molybdenum is preferably formed as a first layer; and an oxide, a nitride, an oxynitride, or a nitride oxide of tungsten, molybdenum, or a mixture of tungsten and molybdenum is preferably formed as a second layer from the first substrate 100 side.

In the case where the separation layer 101 is formed to have a stacked-layer structure of a layer containing tungsten and a layer containing an oxide of tungsten, the layer containing tungsten may be formed first and an insulating layer formed of oxide may be formed thereover so that a layer containing an oxide of tungsten is formed at the interface between the tungsten layer and the insulating layer.

In addition, in the case where the separation layer is formed and then an oxide semiconductor layer is formed as a semiconductor element, the separation layer is heated by heat treatment for dehydration or dehydrogenation of the oxide semiconductor layer. Thus, when the separation layer is separated from the manufacturing substrate in a later step, separation at the interface of the separation layer can be easily performed.

Alternatively, the layer containing an oxide of tungsten may be formed by thermal oxidation treatment, oxygen plasma treatment, treatment with a highly oxidizing solution such as ozone water, or the like on the surface of the layer containing tungsten. Further, plasma treatment or heat treatment may be performed in an atmosphere of oxygen, nitrogen, nitrous oxide alone, or a mixed gas of any of these gasses and another gas. The same applies to the case of forming a layer containing nitride, oxynitride, or nitride oxide of tungsten. After the layer containing tungsten is formed, a silicon nitride layer, a silicon oxynitride layer, or a silicon nitride oxide layer may be formed thereover.

Next, the first insulating layer 111 is formed over the separation layer 101. The first insulating layer 111 is preferably formed as a single layer or a stacked layer of an insulating film containing nitrogen and silicon, such as a silicon nitride, a silicon oxynitride, or a silicon nitride oxide.

The first insulating layer 111 can be formed by a sputtering method, a plasma CVD method, a coating method, a printing method, or the like. For example, the first insulating layer 111 is formed at a temperature of higher than or equal to 250° C. and lower than or equal to 400° C. by a plasma CVD method, whereby a dense film having very low water permeability can be obtained. Note that the first insulating layer 111 is preferably formed to have a thickness of greater than or equal to 10 nm and less than or equal to 3000 nm, further preferably greater than or equal to 200 nm and less than or equal to 1500 nm.

Formation of the first insulating layer 111 makes the separation easy at the interface between the first insulating layer 111 and the separation layer 101 in a later separation step. After a layer 300 to be separated (also referred to as a layer 300) is separated from the first substrate 100, the first insulating layer 111 functions as a protective layer of the layer 300.

Next, the gate electrode layer 103, the conductive layer 104, the capacitor wiring layer 105, the gate electrode layer 106, and the first terminal 102 are formed. The gate electrode layer 103, the conductive layer 104, the capacitor wiring layer 105, the gate electrode layer 106, and the first terminal 102 can be formed to have a single-layer structure or stacked-layer structure using a metal material such as aluminum, chromium, tantalum, titanium, molybdenum, tungsten, silver, copper, gold, platinum, nickel, or palladium, or an alloy material mainly containing any of these materials.

For example, as a two-layer structure of each of the gate electrode layer 103, the conductive layer 104, the capacitor wiring layer 105, the gate electrode layer 106, and the first terminal 102, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure of each of the gate electrode layer 103, the conductive layer 104, the capacitor wiring layer 105, the gate electrode layer 106, and the first terminal 102, a stacked layer of a tungsten layer or a tungsten nitride layer, a layer of an alloy of aluminum and silicon or an alloy of aluminum and titanium, and a titanium nitride layer or a titanium layer is preferable.

Next, the gate insulating layer 107 is formed over the gate electrode layer 103, the conductive layer 104, the capacitor wiring layer 105, the gate electrode layer 106, and the first terminal 102 (see FIG. 2A).

The gate insulating layer 107 can be formed to have a single-layer or stacked-layer structure using a silicon oxide layer, a silicon nitride layer, a silicon oxynitride layer, a silicon nitride oxide layer, or an aluminum oxide layer by a plasma CVD method, a sputtering method, or the like. For example, a silicon oxynitride layer may be formed by a plasma CVD method using $SiH_4$, oxygen, and nitrogen as a deposition gas. The thickness of the gate insulating layer 107 is greater than or equal to 100 nm and less than or equal to 500 nm. In the case where the gate insulating layer 107 is formed to have a stacked-layer structure, for example, a first gate insulating layer having a thickness of greater than or equal to 50 nm and less than or equal to 200 nm and a second gate insulating layer having a thickness of greater than or equal to 5 nm and less than or equal to 300 nm are stacked in this order.

In this embodiment, a silicon oxide layer is formed to have a thickness of 100 nm by a plasma CVD method as the gate insulating layer 107.

Next, an oxide semiconductor layer 108 with a thickness of greater than or equal to 2 nm and less than or equal to 200 nm is formed over the gate insulating layer 107 (see FIG. 2B).

Note that before the oxide semiconductor layer 108 is formed by a sputtering method, dust and the like on the surface of the gate insulating layer 107 is preferably removed by reverse sputtering in which an argon gas is introduced and plasma is generated. The reverse sputtering is a method in which voltage is applied to a substrate side with the use of an RF power source in an argon atmosphere and the surface of the substrate is exposed to plasma so that the surface of the substrate is modified. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used.

The oxide semiconductor layer 108 can be formed using an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Ga—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. Further, the oxide semiconductor layer 108 can be formed by a sputtering method in a rare gas (typically argon) atmosphere, an oxygen atmosphere, or an atmosphere of a rare gas (typically argon) and oxygen. In the case of using a sputtering method, it is preferable that film deposition is performed with the use of a target containing $SiO_2$ at greater than or equal to 2 wt % and less than or equal to 10 wt % so that $SiO_x$ (x>0) which hinders crystallization is contained in the oxide semiconductor layer 108, so that the oxide semiconductor layer 108 is prevented from being crystallized in heat treatment for dehydration or dehydrogenation performed later.

In this embodiment, deposition is performed using an oxide semiconductor target containing In, Ga, and Zn ($In_2O_3$:$Ga_2O_3$:ZnO=1:1:1 [mol %], that is, In:Ga:Zn=1:1:0.5 [atom %]). The deposition condition is set as follows: the distance between the substrate and the target is 90 mm, the substrate temperature is 200° C., the pressure is 0.6 Pa, the direct current (DC) power source is 5 kW, and the atmosphere is a mixed atmosphere of argon and oxygen (argon:oxygen=30 sccm:20 sccm and the oxygen flow rate is 40%). Note that a pulse direct current (DC) power source is preferably used because dust can be reduced and the film thickness becomes uniform. The thickness of the In—Ga—Zn—O-based non-single-crystal film is greater than or equal to 5 nm and less than or equal to 200 nm. In this embodiment, as the oxide semiconductor film, a 30-nm-thick In—Ga—Zn—O-based non-single-crystal film is formed by a sputtering method with the use of an In—Ga—Zn—O-based metal oxide target. As the metal oxide target containing In, Ga, and Zn, a target having a composition ratio of In:Ga:Zn=1:1:1 [atom %] or a target having a composition ratio of In:Ga:Zn=1:1:2 [atom %] can be used.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used when an insulating film is formed, and a DC sputtering method is mainly used when a metal film is formed.

Moreover, there is a multi-source sputtering apparatus in which a plurality of targets of different materials can be set. With the multi-source sputtering apparatus, films of different materials can be formed to be stacked in the same chamber, and a film of plural kinds of materials can be formed at the same time in the same chamber.

In addition, there are a sputtering apparatus provided with a magnet system inside the chamber and used for a magnetron sputtering method, and a sputtering apparatus used for an ECR sputtering method in which glow discharge is not used but plasma generated with the use of microwaves is used.

Furthermore, as a deposition method using sputtering, there are a reactive sputtering method in which a target substance and a sputtering gas component are chemically reacted with each other during deposition to form a thin compound film thereof, and a bias sputtering in which a voltage is applied to a substrate during deposition.

Next, a photolithography step is performed on the oxide semiconductor layer 108 to form resist masks 110a, 110b, and 110c, and then unnecessary portions of the oxide semiconductor layer 108 and the gate insulating layer 107 are etched away, whereby a contact hole 109a reaching the first terminal 102 and a contact hole 109b reaching the conductive layer 104 are formed (see FIG. 2C).

When the contact holes are formed in the gate insulating layer 107 in the state where the oxide semiconductor layer 108 are stacked over the entire surface of the gate insulating layer 107 in such a manner, the resist masks are not directly in contact with the surface of the gate insulating layer 107; accordingly, contamination of the surface of the gate insulating layer 107 (e.g., attachment of impurities or the like to the gate insulating layer 107) can be prevented. Thus, a favorable state of the interface between the gate insulating layer 107 and the oxide semiconductor layer 108 can be obtained, leading to improvement in reliability.

Alternatively, the contact holes may be formed in such a manner that a resist pattern is formed directly on the gate insulating layer 107. In that case, after the resist is removed, heat treatment is preferably performed for dehydration or dehydrogenation of the surface of the gate insulating layer. For example, impurities such as hydrogen and water included in the gate insulating layer 107 may be removed by heat treatment (at higher than or equal to 400° C. and lower than or equal to 750° C.) in an inert gas (e.g., nitrogen, helium, neon, or argon) atmosphere or an oxygen atmosphere.

Next, the resist mask 110a, the resist mask 110b, and the resist mask 110c are removed, and etching is performed with a resist mask 112 and a resist mask 113 which are formed in the photolithography step, whereby an island-shaped oxide semiconductor layers 114 and 115 are formed (see FIG. 3A). Alternatively, the resist masks 112 and 113 for forming the island-shaped oxide semiconductor layers may be formed by an inkjet method. Formation of the resist masks by an inkjet method needs no photomask; thus, manufacturing cost can be reduced.

Next, dehydration or dehydrogenation of the oxide semiconductor layer 114 and the oxide semiconductor layer 115 is performed, whereby an oxide semiconductor layer 116 and an oxide semiconductor layer 117 which are dehydrated or dehydrogenated are formed (see FIG. 3B). The temperature of first heat treatment at which dehydration or dehydrogenation is performed is higher than or equal to 400° C. and lower than or equal to 750° C., preferably higher than or equal to 425° C. and lower than or equal to 750° C. Note that in the case where the temperature is higher than or equal to 425° C., the heat treatment time may be one hour or less, whereas in the case where the temperature is lower than 425° C., the heat treatment time is longer than one hour. Here, the substrate is introduced into an electric furnace which is one of heat treatment apparatuses, and the heat treatment of the oxide semiconductor layers 114 and 115 is performed in a nitrogen atmosphere. After that, the oxide semiconductor layers 114 and 115 are prevented from being exposed to the air, which prevents water or hydrogen from re-entering the oxide semiconductor layers 114 and 115, whereby the oxide semiconductor layers 116 and 117 are obtained. In this embodiment, slow cooling is performed in one furnace in a nitrogen atmosphere from the heating temperature T at which dehydration or dehydrogenation are performed on the oxide semiconductor layers to a temperature low enough to prevent reentry of water; specifically, the slow cooling is performed until the temperature drops by 100° C. or more from the heating temperature T. Without being limited to a nitrogen atmosphere, dehydration or dehydrogenation may be performed in a rare gas atmosphere, such as helium, neon, or argon.

When the oxide semiconductor layers 114 and 115 are subjected to heat treatment at 400° C. to 700° C., the dehydration or dehydrogenation of the oxide semiconductor layers 114 and 115 can be achieved; thus, water ($H_2O$) can be prevented from re-entering the oxide semiconductor layers 114 and 115 in later steps.

The heat treatment apparatus is not limited to the electric furnace, and for example may be an RTA (rapid thermal annealing) apparatus such as a GRTA (gas rapid thermal annealing) apparatus or an LRTA (lamp rapid thermal annealing) apparatus. An LRTA apparatus is an apparatus for heating a process object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. In addition, the LRTA apparatus may be provided with not only a lamp but also a device which heats a process object by heat conduction or heat radiation from a heater such as a resistance heater. GRTA is a method of heat treatment using a high-temperature gas. As the gas, an inert gas which does not react with a process object by heat treatment, such as nitrogen or a rare gas such as argon is used. The heat treatment may be performed at 600° C. to 750° C. for several minutes using an RTA method.

Note that in the first heat treatment, it is preferable that water, hydrogen, and the like be not contained in the atmosphere of nitrogen or a rare gas such as helium, neon, or argon. In particular, the heat treatment which is performed for the dehydration or dehydrogenation of the oxide semiconductor layers 114 and 115 at 400° C. to 750° C. is preferably performed in a nitrogen atmosphere in which the concentration of $H_2O$ is 20 ppm or lower. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Depending on the condition of the first heat treatment or a material of the oxide semiconductor layers 114 and 115, the oxide semiconductor layers 116 and 117 might be crystallized and changed to a microcrystalline film or a polycrystalline film. For example, the oxide semiconductor layers 116 and 117 may become microcrystalline semiconductor layers having a degree of crystallization of 90% or more, or 80% or more. Further, depending on the condition of the first heat treatment or the material of the oxide semiconductor layers 114 and 115, the oxide semiconductor layers 116 and 117 may be an amorphous oxide semiconductor film which does not contain crystalline components. The oxide semiconductor layers 116 and 117 may become oxide semiconductor layers in which a microcrystalline portion (with a grain diameter greater than or equal to 1 nm and less than or equal to 20 nm, typically greater than or equal to 2 nm and less than or equal to 4 nm) is mixed in an amorphous oxide semiconductor. A needle-like crystal in a longitudinal direction (the film-thickness direction) might be generated on the surface side of the oxide semiconductor layers 116 and 117 in the case where heat treatment at a high temperature is performed using RTA (e.g., GRTA or LRTA).

Alternatively, the first heat treatment performed on the oxide semiconductor layers 114 and 115 may be performed on the oxide semiconductor layer 108 which has not yet been processed into the island-shaped oxide semiconductor layers 114 and 115. In that case, the substrate is taken out from the heat apparatus after the first heat treatment, and then a photolithography step is performed.

The heat treatment for dehydration or dehydrogenation of the oxide semiconductor layers 114 and 115 may be performed at any of the following timings: after the oxide semiconductor layers are formed; after a source electrode and a drain electrode are formed over the oxide semiconductor layer; and after a passivation film is formed over the source electrode and the drain electrode.

Note that the etching of the oxide semiconductor layers 114 and 115 here may be dry etching, without being limited to wet etching.

As the etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas including fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used as the etching gas for dry etching.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by KANTO CHEMICAL CO., INC.) may also be used. In this embodiment, ITO07N (produced by KANTO CHEMICAL CO., INC.) is used as an etchant.

The etchant after the wet etching is removed together with the etched materials by cleaning. The waste liquid including the etchant and the etched materials may be purified and the material may be reused. When a material such as indium included in the oxide semiconductor layers is collected from the waste liquid after the etching and reused, the resources can be efficiently used and the cost can be reduced.

In addition, the etching conditions (such as an etchant, etching time, and temperature) are adjusted as appropriate depending on the material so that the films can be etched into desired shapes.

Next, a metal conductive film is formed using a metal material over the oxide semiconductor layers 116 and 117 by a sputtering method, a vacuum evaporation method, or the like.

As the material of the metal conductive film, any of the following materials can be used: an element selected from aluminum, chromium, tantalum, titanium, molybdenum, tungsten, silver, copper, gold, platinum, nickel, or palladium; an alloy including any of these elements; an alloy film containing any of these elements in combination; or the like. Further, the metal conductive film may have a single-layer structure or a stacked-layer structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given.

When heat treatment is performed after the formation of the metal conductive film, it is preferable that the metal conductive film have heat resistance enough to withstand the heat treatment.

Next, a photolithography step is performed to form a resist mask 118a, a resist mask 118b, a resist mask 118c, a resist mask 118d, a resist mask 118e, a resist mask 118f, a resist mask 118g, a resist mask 118h, and a resist mask 118i, and then unnecessary portions of the metal conductive film are etched away, whereby the source electrode layer 119a, the drain electrode layer 119b, the source electrode layer 120a, the drain electrode layer 120b, a capacitor electrode layer 121, the connection electrode 122, the second terminal 123, and the crack suppression layers 124 formed of a metal film are formed (see FIG. 3C).

In this embodiment, as a metal conductive film, a film in which 100-nm-thick titanium is formed over and below 300-nm-thick aluminum is formed. The metal conductive film needs to have a thickness with which resistance can be lowered and mechanical strength can be maintained because a crack suppression layer formed of a metal film is also formed in addition to a source electrode layer, a drain electrode layer, a capacitor electrode layer, and a connection electrode. Specifically, the metal conductive film is formed to have a thickness of greater than or equal to 300 nm and less than or equal to 5000 nm, preferably greater than or equal to 500 nm and less than or equal to 1500 nm.

The crack suppression layer 124 formed of a metal film needs to have a width enough for suppressing progression (growth) of a crack. However, when a width of the crack suppression layer is increased, the number of desired semiconductor devices manufactured from one substrate might be decreased. In view of this, the crack suppression layer formed of a metal film is formed to have a width of greater than or equal to 100 μm and less than or equal to 10000 μm, preferably greater than or equal to 1000 μm and less than or equal to 5000 μm.

Through the photolithography step, the connection electrode 122 and the second terminal 123 are formed in the respective terminal portions. Note that the second terminal 123 is electrically connected to a source electrode layer (that is, a source electrode layer including the source electrode layer 119a and the source electrode layer 120a).

The crack suppression layer 124 formed of a metal film may be formed in a step different from that of the source electrode layer (that is, a source electrode layer including the source electrode layer 119a and the source electrode layer 120a). For example, the crack suppression layer 124 formed of a metal film may be formed in the same step as a gate electrode layer (that is, a gate electrode layer including the gate electrode layer 103 and the gate electrode layer 106). Formation of the crack suppression layer formed of a metal film in the same step as the gate electrode layer or the source electrode layer makes it possible to form the crack suppression layer of a metal film without increasing the number of formation steps, which is preferable.

Note that the planar shape of the crack suppression layer 124 formed of a metal film can be square, rectangular, circular, oval, or the like. The crack suppression layer 124 formed of a metal film is formed in the periphery of a semiconductor element. In the periphery of the semiconductor element, the crack suppression layer may be formed continuously or may be formed to have an island shape. Alternatively, the crack suppression layer which is formed continuously and the crack suppression layer which is formed to have an island shape may be combined. Further alternatively, a plurality of crack suppression layers which is formed continuously may be formed. Note that the crack suppression layer is preferably formed continuously so as to surround the semiconductor element because possibility of suppressing a crack progression to the semiconductor element is increased.

In this embodiment, as shown in FIG. 1A, the crack suppression layer 124 is formed continuously in the periphery of the semiconductor element 203 so as to surround the semiconductor element 203 to have a width of 1200 μm and a rectangle shape.

The resist masks 118a, 118b, 118c, 118d, 118e, 118f, 118g, 118h, and 118i for forming the source electrode layer 119a, the source electrode layer 120a, the drain electrode layer 119b, the drain electrode layer 120b, the connection electrode 122, the second terminal 123, and the crack suppression layers 124 may be formed by an inkjet method, in which case photomask is not needed, and thus manufacturing cost can be reduced.

Next, the resist masks 118a, 118b, 118c, 118d, 118e, 118f, 118g, 118h, and 118i are removed and the insulating layer 125 functioning as a protective insulating film in contact with the oxide semiconductor layers 116 and 117 is formed (see FIG. 4A).

At this stage, the oxide semiconductor layer 116 and the oxide semiconductor layer 117 each have a region in contact with the insulating layer 125. In each of the regions, regions overlapping with the gate electrode layer and the gate insulating layer are a channel formation region 126 and a channel formation region 128.

The insulating layer 125 can be formed to have a thickness of at least 1 nm, using a method with which impurities such as water or hydrogen are not mixed into the insulating layer 125 such as a sputtering method as appropriate. In this embodiment, a 300-nm-thick silicon oxide film is formed as the insulating layer 125 by a sputtering method. The substrate temperature in the deposition may be higher than or equal to room temperature and lower than or equal to 300° C., and in this embodiment, the temperature is room temperature. The deposition of the silicon oxide film by a sputtering method can be performed in a rare gas (typically, argon) atmosphere, an oxygen atmosphere, or an atmosphere including a rare gas (typically, argon) and oxygen. As a target, a silicon oxide target or a silicon target may be used. For example, the silicon oxide film can be formed by a sputtering method with the use of a silicon target in an oxygen atmosphere. As the insulating layer 125 which is formed in contact with the oxide semiconductor layers whose resistance is reduced, an inorganic insulating film which does not contain impurities such as moisture, a hydrogen ion, and OFF and blocks entry of these from the outside is used. Typically, a silicon oxide film, a silicon nitride oxide film, an aluminum oxide film, an aluminum oxynitride film, or the like is used.

Next, second heat treatment is performed in an inert gas atmosphere or a nitrogen atmosphere (preferably at a temperature of higher than or equal to 200° C. and lower than or equal to 400° C., for example, higher than or equal to 250° C. and lower than or equal to 350° C.). For example, the second heat treatment is performed at 250° C. for one hour in a nitrogen atmosphere. In the second heat treatment, respective parts of the oxide semiconductor layer 116 and the oxide semiconductor layer 117 overlapping with the insulating layer 125 are heated in the state of being in contact with the insulating layer 125.

Owing to the second heat treatment, oxygen enters each of the oxide semiconductor layers from the exposed portions (the channel formation region 126 and the channel formation region 128) of the oxide semiconductor layers between the source regions and the drain regions, and is diffused thereinto. Formation of the silicon oxide film by a sputtering method makes it possible to contain an excessive amount of oxygen in the silicon oxide film, and the oxygen can enter the oxide semiconductor layers and can be diffused thereinto through the second heat treatment. Oxygen enters the oxide semiconductor layers and is diffused thereinto, whereby the channel regions can have higher resistance (i.e., the channel region can have i-type conductivity). Therefore, normally-off transistors can be obtained. Therefore, reliability of the semiconductor device can be improved.

Specifically, in the oxide semiconductor layer 116, the channel formation region 126 overlapping with the gate electrode layer 103 becomes i-type, and a high-resistance source region 127a overlapping with the source electrode layer 119a and a high-resistance drain region 127b overlapping with the drain electrode layer 119b are formed in a self-aligned manner. Similarly, in the oxide semiconductor layer 117, the channel formation region 128 overlapping with the gate electrode layer 106 becomes i-type, and a high-resistance source region 129a overlapping with the source electrode layer 120a and a high-resistance drain region 129b overlapping with the drain electrode layer 120b are formed in a self-aligned manner (see FIG. 4A).

In the oxide semiconductor layer 116 and the oxide semiconductor layer 117 overlapping with the drain electrode layer 119b and the drain electrode layer 120b (and the source electrode layer 119a and the source electrode layer 120a), respectively, the high-resistance drain region 127b and the high-resistance drain region 129b (or the high-resistance source region 127a and the high-resistance source region 129a) are formed, so that reliability can be increased when a circuit is formed. Specifically, the high-resistance drain region 127b and the high-resistance drain region 129b are formed, whereby a structure can be obtained in which conductivity gradually changes from the drain electrode layers 119b and 120b, the high-resistance drain regions 127b and 129b, to the channel formation regions 126 and 128. Therefore, when the transistor operates with the drain electrode layers 119b and 120b each connected to a wiring that supplies a high power supply potential VDD, the high-resistance drain regions serve as buffers and a high electric field is not applied locally even if a high electric field is applied between the gate electrode layers 103 and 106 and the drain electrode layers 119b and 120b, respectively; thus, the withstand voltage of the transistor can be improved.

Further, in the oxide semiconductor layers overlapping with the drain electrode layer 119b and the drain electrode layer 120b (and the source electrode layer 119a and the source electrode layer 120a), the high-resistance drain region 127b and the high-resistance drain region 129b (or the high-resistance source region 127a and the high-resistance source region 129a) are formed, so that leakage current can be reduced in the channel formation region 126 and the channel formation region 128 in the case where a circuit is formed.

Furthermore, the high-resistance source region or the high-resistance drain region in the oxide semiconductor layer is formed in the entire thickness direction in the case where the thickness of the oxide semiconductor layer is as small as 15 nm or less. In the case where the thickness of the oxide semiconductor layer is as large as 30 nm or more and 50 nm or less, resistance is reduced in part of the oxide semiconductor layer, that is, in a region in contact with the source electrode layer or the drain electrode layer and a periphery thereof, thereby forming the high-resistance source region or the high-resistance drain region, and a region in the oxide semiconductor layer that is close to the gate insulating layer can be made to be i-type.

A protective insulating layer 132 may be formed over the insulating layer 125. For example, a silicon nitride film is formed by an RF sputtering method. The RF sputtering method is preferable as a deposition method of the protective insulating layer because it achieves high mass productivity. As the protective insulating layer, an inorganic insulating film which does not include impurities such as moisture, a hydrogen ion, and OH⁻ and blocks entry of these from the outside is used: a silicon nitride film, an aluminum nitride film, a silicon nitride oxide film, or an aluminum oxynitride film is used. In this embodiment, the protective insulating layer 132 is formed using a silicon nitride film (see FIG. 4A).

Through the above steps, the transistor 133 in the driver circuit portion, the transistor 134 in the pixel circuit portion, and the capacitor 135 can be manufactured over one substrate. Each of the transistors 133 and 134 is a bottom-gate transistor including an oxide semiconductor layer in which a high-resistance source region, a high-resistance drain region, and a channel formation region are formed: since the high-resistance drain region or the high-resistance source region serves as a buffer, even when a high electric field is applied, the transistors 133 and 134 are prevented from being supplied with a high electric field locally and have improved withstand voltage. Further, formation of the driver circuit portion and the pixel circuit portion over one substrate makes it possible to shorten a connection wiring, leading reduction in size and cost of the semiconductor device (light-emitting device).

The capacitor 135 is formed using the capacitor wiring layer 105, and the capacitor electrode layer 121, in which the gate insulating layer 107 in the capacitor portion is used as a dielectric.

Then, the color filter layer 136 is formed over the protective insulating layer 132. The color filter layer 136 includes a green color filter layer, a blue color filter layer, a red color filter layer, or the like, and a green color filter layer, a blue color filter, and a red color filter layer are sequentially formed. Each color filter layer is formed by a printing method, an inkjet method, an etching method using a photolithography technique, or the like. Accordingly, alignment of the color filter layer 136 and light-emitting region of light-emitting elements can be performed without depending on the attachment accuracy of the sealing substrate. In this embodiment, a photolithography step is performed to form a green color filter layer, a blue color filter layer, and a red color filter layer (see FIG. 4B).

Next, an overcoat layer 137 which covers the color filter layers (the green color filter layer, the blue color filter layer, and the red color filter layer) is formed. The overcoat layer 137 is formed using a light-transmitting resin.

Here, an example in which full color display is performed using three colors of R, G, and B is described; however, the invention is not particularly limited thereto, and full color display may be performed using four colors of R, G, B, and W.

Next, a protective insulating layer 138 which covers the overcoat layer 137 and the protective insulating layer 132 is formed (see FIG. 4B). For the protective insulating layer 138, an inorganic insulating film such as a silicon nitride film, an aluminum nitride film, a silicon nitride oxide film, or an aluminum oxynitride film is used. It is preferable that the protective insulating layer 138 be an insulating film having the same composition as that of the protective insulating layer 132, in which case they can be etched in one step when a contact hole is formed later.

Figures 5A, 5B:
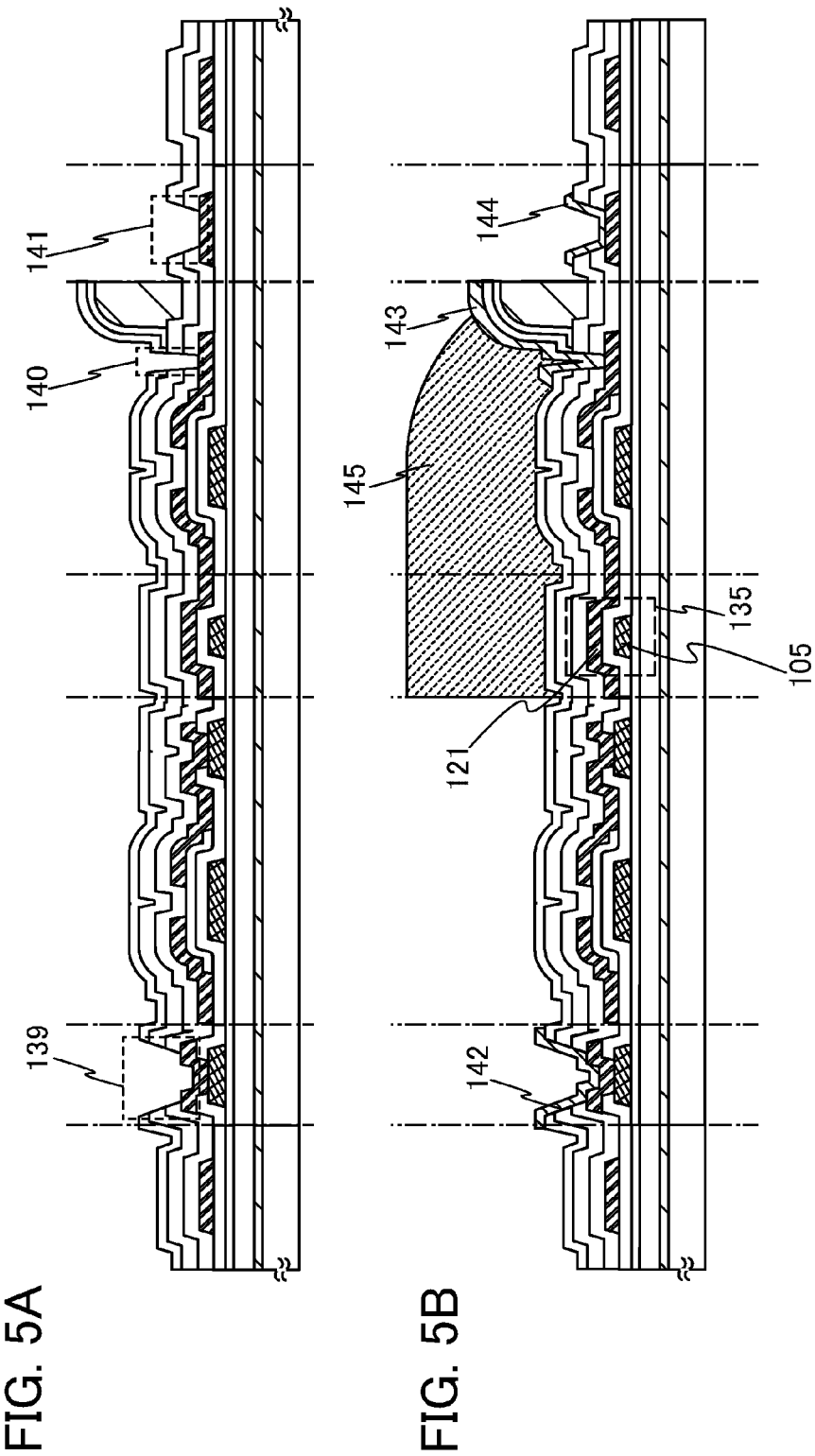
FIGS. 5A and 5B are diagrams showing an embodiment of a method for manufacturing the semiconductor device.

Next, a resist mask is formed by a photolithography step and the protective insulating layer 138, the protective insulating layer 132, and the insulating layer 125 are etched to form the contact hole 140 reaching the drain electrode layer 120b, and then the resist mask is removed (see FIG. 5A). In this etching step, a contact hole 141 reaching the second terminal 123 and a contact hole 139 reaching the connection electrode 122 are also formed. Note that the resist mask for forming the contact holes may be formed by an inkjet method, in which case there is no need to use photomask; thus, manufacturing cost can be reduced.

Next, a light-transmitting conductive film is formed. The light-transmitting conductive film is formed from indium oxide ($In_2O_3$), an alloy of indium oxide and tin oxide ($In_2O_3$—$SnO_2$, abbreviated to ITO), or the like by a sputtering method, a vacuum evaporation method, or the like. Alternatively, an Al—Zn—O-based non-single-crystal film containing nitrogen, a Zn—O-based non-single-crystal film containing nitrogen, or a Sn—Zn—O-based non-single-crystal film containing nitrogen may be used. Note that the composition ratio (atomic %) of zinc in the Al—Zn—O-based non-single-crystal film containing nitrogen is less than or equal to 47 atomic % and is higher than the composition ratio (atomic %) of aluminum in the non-single-crystal film, and the composition ratio (atomic %) of aluminum in the non-single-crystal film is higher than the composition ratio (atomic %) of nitrogen in the non-single-crystal film. Such a material is etched with a hydrochloric acid-based solution. However, since a residue is easily generated particularly in etching of ITO, an alloy of indium oxide-zinc oxide ($In_2O_3$—ZnO) may be used to improve etching processability.

Note that the unit of the composition ratio in the light-transmitting conductive film is atomic %, and the composition ratio of components is evaluated by analysis using an electron probe X-ray microanalyzer (EPMA).

Next, a photolithography step is performed to form a resist mask, and unnecessary portions of the light-transmitting conductive film are removed by etching, so that the first electrode layer 143, the terminal electrode 142, and the terminal electrode 144 are formed. Then, the resist mask is removed (see FIG. 5B).

Note that the capacitor 135, which includes the gate insulating layer 107 as a dielectric, the capacitor wiring layer 105, and the capacitor electrode layer 121, can be formed over the same substrate as the driver circuit portion and the pixel portion. In the semiconductor device 200, the capacitor electrode layer 121 is part of a power supply line, and the capacitor wiring layer 105 also functions as a part of the gate electrode layer of the driving TFT.

The terminal electrodes 142 and 144 which are formed in the terminal portion function as electrodes or wirings connected to an FPC. The terminal electrode 142 formed over the first terminal 102 with the connection electrode 122 therebetween is a connection terminal electrode functioning as an input terminal for the gate wiring. The terminal electrode 144 formed over the second terminal 123 is a connection terminal electrode functioning as an input terminal for the source wiring.

Next, a partition 145 is formed so as to cover the periphery of the first electrode layer 143. The partition 145 is formed using a film of an organic resin such as polyimide, acrylic, polyamide, or epoxy, an inorganic insulating film, or a siloxane-based resin.

Note that the siloxane-based resin corresponds to a resin containing a Si—O—Si bond formed using a siloxane-based material as a starting material. The siloxane-based resin may contain, as a substituent, an organic group (e.g., an alkyl group, an aryl group, or a fluoro group).

The partition 145 can be formed using phosphosilicate glass (PSG), borophosphosilicate glass (BPSG), or the like. Note that the partition 145 may be formed by stacking a plurality of insulating films formed using any of these materials.

There is no particular limitation on the method for forming the partition 145: depending on the material, a sputtering method, an SOG method, a spin coating method, a dipping method, a spray coating method, or a droplet discharge method (e.g., an inkjet method, screen printing, or offset printing), or a means such as a doctor knife, a roll coater, a curtain coater, or a knife coater can be used. Further, other insulating layers used in the semiconductor device (light-emitting device) may be formed using the materials and the methods which are shown as examples of the materials and the methods of the partition 145.

It is particularly preferable that the partition 145 be formed using a photosensitive resin material to have an opening portion over the first electrode layer 143 so that a sidewall of the opening portion is formed as a tilted surface with continuous curvature. When a photosensitive resin material is used for the partition 145, a step of forming a resist mask can be omitted.

Through the above steps, the semiconductor device 200 in which the semiconductor element formation process is completed and which includes the crack suppression layer formed of a metal film shown in FIG. 1A can be manufactured.

Here, a method for separating the semiconductor device 200 from the first substrate 100 will be described in detail with reference to FIG. 6, FIGS. 7A and 7B, FIGS. 8A and 8B, and FIG. 9.

First, a second substrate 302 is temporarily bonded to the layer 300 using an adhesive layer 301 which can be removed (also referred to as an adhesive layer 301). By bonding the second substrate 302 to the layer 300, the layer 300 can be easily separated from the separation layer 101. With the adhesive layer 301, the stress added to the layer 300 is lowered, so that the transistor can be protected. Further, with the adhesive layer 301, the second substrate 302 can be easily removed after use (see FIG. 6).

As the adhesive layer 301, for example, a water-soluble resin can be used. Unevenness of the layer 300 is reduced by applying the water soluble-resin, so that the layer 300 can be easily bonded to the second substrate 302. In addition, as the adhesive layer 301, a stack of a water-soluble resin and an adhesive which can be separated by light or heat may be used.

A material with high mechanical strength is preferably used for the second substrate 302, in which case the layer 300 can be separated without suffering physical damage. In this embodiment, a quartz substrate is used as the second substrate 302.

Figure 6:
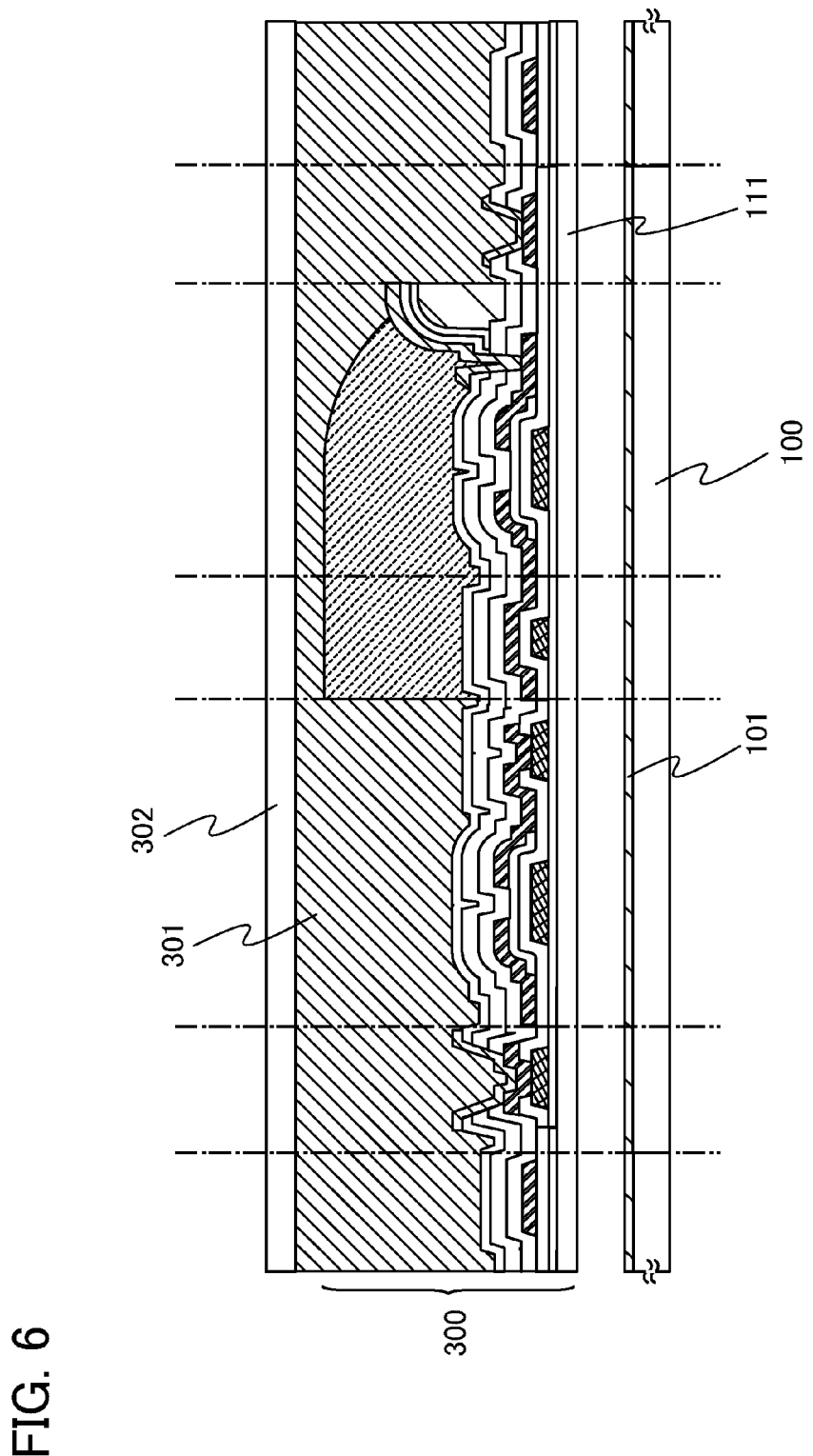
FIG. 6 is a diagram showing an embodiment of a method for manufacturing the semiconductor device.

Next, the layer 300 is separated from the first substrate 100 (see FIG. 6). As a separation method, any of various methods can be employed.

In the case where the first insulating layer 111 is formed over the separation layer 101, a metal oxide film is formed at the interface between the separation layer 101 and the first insulating layer 111 by heating the separation layer 101 and the first insulating layer 111 in a step of forming a semiconductor element. The metal oxide film is embrittled because of a groove reaching the separation layer 101, so that the separation is performed at the interface between the separation layer 101 and the first insulating layer 111.

For example, as the separation method, mechanical force (a separation process with a human hand or with a gripper, a separation process by rotation of a roller, or the like) may be used. Alternatively, a liquid may be dropped into the groove to allow the liquid to be infiltrated into the interface between the separation layer 101 and the first insulating layer 111, which may be followed by the separation of the layer 300 from the separation layer 101. Further alternatively, a method may be used in which a fluoride gas such as $NF_3$, $BrF_3$, or $ClF_3$ is introduced into the groove and the separation layer 101 is removed by etching with the use of the fluoride gas so that the layer 300 is separated from the first substrate 100 having an insulating surface. Further, the separation may be performed while pouring a liquid such as water between the separation layer 101 and the layer 300 during the separation.

As another separation method, in the case where the separation layer 101 is formed using tungsten, separation can be performed while the separation layer 101 is etched by a mixed solution of ammonia water and hydrogen peroxide water.

When a film containing nitrogen, oxygen, hydrogen, or the like (e.g., an amorphous silicon film containing hydrogen, an alloy film containing hydrogen, or an alloy film containing oxygen) is used as the separation layer 101 and a substrate having a light-transmitting property is used as the first substrate 100, the following manner can be used: the separation layer 101 is irradiated with laser light through the first substrate 100, and nitrogen, oxygen, or hydrogen contained in the separation layer is evaporated, so that separation can occur between the first substrate 100 and the separation layer 101.

Next, a third substrate 1100 which is thin, lightweight and has a light-transmitting property is bonded to the layer 300 using a resin layer 1101 (see FIG. 7A).

As the third substrate 1100 which is thin, lightweight and has a light-transmitting property, a substrate having flexibility and a light-transmitting property with respect to visible light can be used: for example, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, or a polyvinylchloride resin, or the like is preferably used. In addition, over the third substrate 1100, a protective film with low water permeability, such as a film containing nitrogen and silicon, e.g., a silicon nitride film or a silicon oxynitride film, or a film containing nitrogen and aluminum e.g., an aluminum nitride film, may be formed in advance. Note that a structure body in which a fibrous body is impregnated with an organic resin (so-called a prepreg) may be used as the third substrate 1100.

The semiconductor device described in this embodiment is a bottom-emission-type light-emitting device in which light is emitted through the third substrate 1100 side, so that a substrate having a light-transmitting property is used as the third substrate 1100; however, in the case where the light-emitting device has a top-emission structure in which light is emitted through the surface opposite to the third substrate 1100 side, a non-light-transmitting metal substrate that is made thin enough to have flexibility may be used as the third substrate 1100. The metal substrate is provided on the side through which light is not extracted. A material for forming the metal substrate is not limited to a particular material, but aluminum, copper, nickel, an alloy of metal such as an aluminum alloy or stainless steel, or the like can be preferably used.

In the case where a fibrous body is included in the material of the third substrate 1100, a high-strength fiber of an organic compound or an inorganic compound is used as the fibrous body. The high-strength fiber is specifically a fiber with a high tensile modulus of elasticity or a fiber with a high Young's modulus. As a typical example of the high-strength fiber, a polyvinyl alcohol based fiber, a polyester-based fiber, a polyamide-based fiber, a polyethylene-based fiber, an aramid-based fiber, a polyparaphenylene benzobisoxazole fiber, a glass fiber, or a carbon fiber can be given. As a glass fiber, there is a glass fiber using E glass, S glass, D glass, Q glass, or the like. These fibers are used in a state of a woven fabric or a nonwoven fabric, and a structure body in which this fibrous body is impregnated with an organic resin and the organic resin is cured may be used as the third substrate 1100. When the structure body including the fibrous body and the organic resin is used as the third substrate 1100, reliability against bending or breaking due to local pressure can be increased, which is preferable.

Note that in the case where the third substrate 1100 includes the above fibrous body, in order to reduce prevention of light emitted from the light-emitting element to the outside, the fibrous body is preferably a nanofiber with a diameter of 100 nm or less. Further, refractive indexes of the fibrous body and the organic resin or the adhesive preferably match with each other.

For the resin layer 1101, various curable adhesives, e.g., a light curable adhesive such as a UV curable adhesive, a reactive curable adhesive, a thermal curable adhesive, and an anaerobic adhesive can be used. For the material of the adhesive, an epoxy resin, an acrylic resin, a silicone resin, a phenol resin, or the like can be used.

Note that in the case where a prepreg is used for the third substrate 1100, the layer 300 and the third substrate 1100 are directly bonded to each other by pressure bonding without using the adhesive. At this time, as the organic resin for the structure body, a reactive curable resin, a thermal curable resin, a UV curable resin, or the like which is better cured by additional treatment is preferably used.

After forming the third substrate 1100, the second substrate 302 and the adhesive layer 301 are removed, whereby the first electrode layer 143 is exposed (see FIG. 7B).

Note that this embodiment shows an example where the adhesive layer 301 which can be removed is used; however, when a prepreg or the like is used for the third substrate 1100, it is not necessarily removed.

Through the above steps, the layer 300 in which components up to and including the driver circuit portion 201, the transistor 134, and the first electrode layer 143 of the light-emitting element are formed over the third substrate 1100 can be formed.

Next, an EL layer 193 is formed over the first electrode layer 143 and the partition 145. The EL layer 193 can be formed using either a low-molecular material or a high-molecular material. Note that, a material of the EL layer 193 is not limited to a material containing only an organic compound material, and it may partially contain an inorganic compound material. Alternatively, the EL layer 193 has at least a light-emitting layer, and a single-layer structure that is formed using a single light-emitting layer or a stacked structure including layers having different functions may be used. For example, functional layers such as a hole-injection layer, a hole-transport layer, a carrier-blocking layer, an electron-transport layer, an electron-injection layer, and the like can be combined as appropriate in addition to a light-emitting layer. Note that a layer having two or more of the functions of the layers may be included (see FIG. 8A).

The EL layer 193 can be formed using either a wet process or a dry process, such as an evaporation method, an inkjet method, a spin coating method, a dip coating method, or a nozzle printing method.

Next, the second electrode layer 194 is formed over the EL layer 193. Note that in the case where the first electrode layer 143 serves as an anode, the second electrode layer 194 serves as a cathode and in the case where the first electrode layer 143 serves as a cathode, the second electrode layer 194 serves as an anode; therefore, the first electrode layer 143 and the second electrode layer 194 are formed by selecting a material having a work function corresponding to the polarity of the respective electrode layers.

In this embodiment, the first electrode layer 143 is used as an anode, and the EL layer 193 has a structure in which a hole-injection layer, a hole-transport layer, a light-emitting layer, and an electron-injection layer are sequentially stacked from the first electrode layer 143 side. Various kinds of materials can be used for the light-emitting layer. For example, a fluorescent compound which exhibits fluorescence or a phosphorescent compound which exhibits phosphorescence can be used. In addition, as the second electrode layer 194, a material having a low work function is used. Since light is emitted through the first electrode layer 143 side, a highly reflective material is selected for the second electrode layer 194.

Further, a protective layer may be formed over the second electrode layer 194. For example, the protective layer is formed as a single-layer or a stacked-layer using a material containing nitrogen and silicon such as silicon nitride, silicon nitride oxide, or silicon oxynitride; aluminum oxide; or the like by a sputtering method, a plasma CVD method, a coating method, a printing method, or the like. Alternatively, the above inorganic insulating film and an organic insulating film such as a resin film may be stacked to form the protective layer. By forming the protective layer, moisture and gas such as oxygen can be prevented from entering the element portion. The thickness of the protective layer is preferably greater than or equal to 10 nm and less than or equal to 1000 nm, further preferably, greater than or equal to 100 nm and less than or equal to 700 nm.

Next, a fourth substrate 1200 is bonded using a resin layer 1201 to cover the driver circuit portion 201, the pixel circuit portion 202, and the crack suppression region 205 (see FIG. 8B).

The resin layer 1201 is preferably formed using a material with good adhesion properties. Examples of materials used for formation of the resin layer 1201 include an organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin; an inorganic siloxane polymer containing a Si—O—Si bond among compounds containing silicon, oxygen, and hydrogen formed by using a siloxane-polymer-based material typified by silica glass as a starting material; or an organic siloxane polymer in which hydrogen bonded with silicon is substituted by an organic group such as methyl or phenyl, typified by an alkylsiloxane polymer, an alkylsilsesquioxane polymer, a silsesquioxane hydride polymer, or an alkylsilsesquioxane hydride polymer. Further, a fibrous body may be included in these materials of the resin layer 1201.

The resin layer 1201 can be formed, for example, by applying a composition using a coating method and then drying and heating. Alternatively, a structure body in which a fibrous body is impregnated with an organic resin may be used for the resin layer 1201.

As the fourth substrate 1200, a substrate which is thin and has low water permeability is used: for example, a metal substrate can be used. A material for forming the metal substrate is not limited to a particular material; however, aluminum, copper, nickel, an alloy of metals such as an aluminum alloy or stainless steel, or the like can be preferably used. Note that before bonding, the fourth substrate 1200 is preferably subjected to baking or plasma treatment in vacuum so as to remove moisture attached to the surface of the metal substrate. Note that a resin film may also be formed on the surface of the fourth substrate 1200 to protect the fourth substrate 1200.

The fourth substrate 1200 can also be bonded using a laminator. For example, a sheet-like adhesive is applied to the metal substrate using a laminator and the metal substrate may further be bonded to the pixel circuit portion 202 and the driving circuit portion 201 using a laminator. Alternatively, the resin layer 1201 is printed on the fourth substrate 1200 by screen printing or the like and the fourth substrate 1200 is bonded to the light-emitting element using a laminator. Note that this process is preferably carried out under a reduced pressure because bubbles are hardly entered.

Through the above steps, the driver circuit portion 201, the pixel circuit portion 202, and the crack suppression region 205 are sandwiched between the flexible third substrate 1100 and the flexible fourth substrate 1200.

As described above, there is a plurality of steps of separating the layer 300 from the first substrate 100 and providing the layer 300 between the flexible third substrate 1100 and the flexible fourth substrate 1200. Provision of the crack suppression region 205 in the periphery of the semiconductor device 200 makes it possible to separate the semiconductor device 200 with high yield and transfer it to a flexible substrate without damaging the semiconductor device 200 due to a crack occurring from the outer periphery of the substrate.

Figure 9:
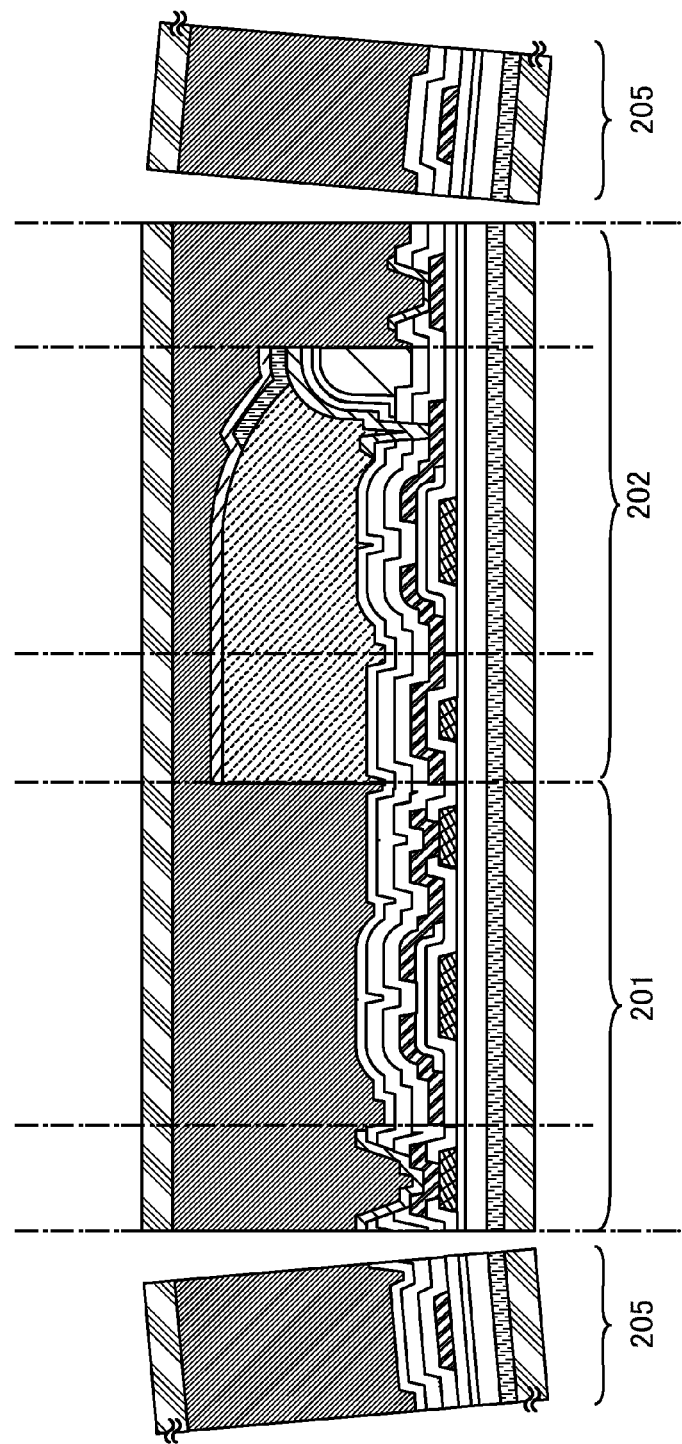
FIG. 9 is a diagram showing an embodiment of a method for manufacturing the semiconductor device.

Next, the crack suppression region 205 is removed, and the semiconductor element including the driver circuit portion 201 and the pixel circuit portion 202 is formed over the flexible substrate (see FIG. 9).

A method for removing the crack suppression region 205 can be selected as appropriate depending on materials of the third substrate 1100 and the fourth substrate 1200. Typically, a cutter knife, laser, or the like is used. In this embodiment, laser light irradiation is used for removing the crack suppression region 205.

There is no particular limitation on the conditions such as wavelength, intensity, and beam size of the laser beam used for the removing step: the laser light irradiation can be performed under any conditions as long as the semiconductor devices can be divided. As a laser, it is possible to use, for example, a continuous-wave laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a pulsed laser such as an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

Although this embodiment shows an example of removing the crack suppression region 205, the crack suppression region may be used as part of the semiconductor device without being removed.

Note that this embodiment shows a method in which the transistors 133 and 134 and the first electrode layer 143 of the light-emitting element and formed in the layer 300 as an example; however, the invention disclosed in this specification is not limited thereto. The separation and transfer may be performed after the light-emitting element is formed (i.e., after the second electrode layer 194 of the light-emitting element is formed). Further, the layer 300 including only the first insulating layer 111 and the first electrode layer 143 may be separated and transferred to the substrate, and then the transistor and the light-emitting element may be manufactured. Furthermore, only the first insulating layer 111 may be formed over the manufacturing substrate, separated and transferred to the substrate, and then the transistor and the light-emitting element may be manufactured.

Although an active matrix light-emitting device is described as an example of a semiconductor device in this embodiment, the present invention can also be applied to a manufacturing method of a passive matrix light-emitting device.

Although a light-emitting device is described as an example of a semiconductor device in this embodiment, the present invention can be applied to all semiconductor devices that can function by utilizing semiconductor properties, such as liquid crystal display devices, semiconductor circuits, and electronic devices and manufacturing methods thereof.

According to this embodiment, a transistor manufactured using a substrate having high heat resistance can be transferred to a third substrate which is thin, lightweight and has a light-transmitting property. Therefore, a transistor with high reliability and favorable electric characteristics can be formed without being restricted by the heat resistance of the third substrate. A semiconductor device in which such a transistor is formed in a pixel portion and a driving circuit portion formed over one substrate has high reliability and operation characteristics.

As described above, provision of the crack suppression layer formed of a metal film in the periphery of the semiconductor element makes it possible to suppress a crack occurring from the outer periphery of the substrate and reduce damage to the semiconductor element due to the crack. In addition, even if the semiconductor device is subjected to physical forces from the outer periphery in the separation and transposition steps, progression (growth) of a crack to the semiconductor device can be suppressed by the crack suppression layer.

Embodiment 2

This embodiment shows an example of forming a crack suppression layer formed of a resin layer, which is different from the crack suppression layer formed of a metal film in Embodiment 1, with reference to FIGS. 14A and 14B, FIGS. 15A and 15B, and FIGS. 16A and 16B. Therefore, part of this embodiment can be performed in a manner similar to that of Embodiment 1; thus, repetitive description of the same portions as or portions having functions similar to those in Embodiment 1 and steps for forming such portions will be omitted. Since FIGS. 14A and 14B, FIGS. 15A and 15B, and FIGS. 16A and 16B are the same as FIGS. 1A and 1B, FIGS. 2A to 2C, FIGS. 3A to 3C, FIGS. 4A and 4B, FIGS. 5A and 5B, FIG. 6, FIGS. 7A and 7B, FIGS. 8A and 8B, and FIG. 9 except for part of steps, the same portions are denoted by the same reference numerals and detailed description thereof will not be repeated.

First, in accordance with Embodiment 1, the separation layer 101, the first insulating layer 111, the gate electrode layer 103, the conductive layer 104, the capacitor wiring layer 105, the gate electrode layer 106, the first terminal 102, the gate insulating layer 107, the contact hole 109a, the contact hole 109b, the oxide semiconductor layer 116, and the oxide semiconductor layer 117 are formed over the substrate 100 (see FIG. 14A).

Next, a metal conductive film formed using a metal material is formed over the oxide semiconductor layer 116, the oxide semiconductor layer 117, and the gate insulating layer 107 by a sputtering method, a vacuum evaporation method, or the like.

As the material of the metal conductive film, any of the following materials can be used: an element selected from aluminum, chromium, tantalum, titanium, molybdenum, tungsten, silver, copper, gold, platinum, nickel, or palladium; an alloy containing any of these elements; an alloy film containing any of these elements in combination; or the like. Further, the metal conductive film may have a single-layer structure or a stacked-layer structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given.

When heat treatment is performed after the formation of the metal conductive film, it is preferable that the metal conductive film have heat resistance enough to withstand the heat treatment.

Next, a photolithography step is performed to form a resist mask 150a, a resist mask 150b, a resist mask 150c, a resist mask 150d, a resist mask 150e, a resist mask 150f, and a resist mask 150g, and unnecessary portions of the metal conductive film are etched away, so that the source electrode layer 119a, the drain electrode layer 119b, the source electrode layer 120a, the drain electrode layer 120b, the capacitor electrode layer 121, the connection electrode 122, and the second terminal 123 are formed (see FIG. 14B).

In this embodiment, as the metal conductive film, a film in which 100-nm-thick titanium is formed over and below 300-nm-thick aluminum is formed.

Note that the resist masks 150a, 150b, 150c, 150d, 150e, 150f, and 150g for forming the source electrode layer 119a, the source electrode layer 120a, the drain electrode layer 119b, the drain electrode layer 120b, the connection electrode 122, and the second terminal 123 may be formed by an inkjet method, in which case photomask is not needed, and thus manufacturing cost can be reduced.

Next, the resist masks 150a, 150b, 150c, 150d, 150e, 150f, and 150g are removed and the insulating layer 125 functioning as a protective insulating film in contact with the oxide semiconductor layers 116 and 117 is formed (see FIG. 15A).

At this stage, the oxide semiconductor layer 116 and the oxide semiconductor layer 117 each have a region in contact with the insulating layer 125. In each of the regions, regions overlapping with the gate electrode layer and the gate insulating layer are a channel formation region 126 and a channel formation region 128.

The insulating layer 125 can be formed to have a thickness of at least 1 nm, using a method with which impurities such as water or hydrogen are not mixed into the insulating layer 125 such as a sputtering method as appropriate. In this embodiment, a 300-nm-thick silicon oxide film is formed as the insulating layer 125 by a sputtering method. The substrate temperature in the deposition may be higher than or equal to room temperature and lower than or equal to 300° C., and in this embodiment, the temperature is room temperature. The deposition of the silicon oxide film by a sputtering method can be performed in a rare gas (typically, argon) atmosphere, an oxygen atmosphere, or an atmosphere including a rare gas (typically, argon) and oxygen. As a target, a silicon oxide target or a silicon target may be used. For example, the silicon oxide film can be formed by a sputtering method with the use of a silicon target in an oxygen atmosphere. As the insulating layer 125 which is formed in contact with the oxide semiconductor layer whose resistance is reduced, an inorganic insulating film which does not contain impurities such as moisture, a hydrogen ion, and OFF and blocks entry of these from the outside is used. Typically, a silicon oxide film, a silicon nitride oxide film, an aluminum oxide film, an aluminum oxynitride film, or the like is used.

Next, second heat treatment is performed in an inert gas atmosphere or a nitrogen atmosphere (preferably at a temperature of higher than or equal to 200° C. and lower than or equal to 400° C., for example, higher than or equal to 250° C. and lower than or equal to 350° C.). For example, the second heat treatment is performed at 250° C. for one hour in a nitrogen atmosphere. In the second heat treatment, respective parts of the oxide semiconductor layers 116 and 117 overlapping with the insulating layer 125 are heated in the state of being in contact with the insulating layer 125.

Owing to the second heat treatment, oxygen enters each of the oxide semiconductor layers from the exposed portions (the channel formation region 126 and the channel formation region 128) of the oxide semiconductor layers between the source regions and the drain regions, and is diffused thereinto. Formation of the silicon oxide film by a sputtering method makes it possible to contain an excessive amount of oxygen in the silicon oxide film, and the oxygen can enter the oxide semiconductor layers and can be diffused thereinto through the second heat treatment. Oxygen enters the oxide semiconductor layers and is diffused thereinto, whereby the channel formation region 126 and the channel formation region 128 can have higher resistance (i.e., the channel formation regions can have i-type conductivity). Therefore, normally-off transistors can be obtained. Therefore, reliability of the semiconductor device can be improved.

Specifically, in the oxide semiconductor layer 116, the channel formation region 126 overlapping with the gate electrode layer 103 becomes i-type, and a high-resistance source region 127a overlapping with the source electrode layer 119a and a high-resistance drain region 127b overlapping with the drain electrode layer 119b are formed in a self-aligned manner. Similarly, in the oxide semiconductor layer 117, the channel formation region 128 overlapping with the gate electrode layer 106 becomes i-type, and a high-resistance source region 129a overlapping with the source electrode layer 120a and a high-resistance drain region 129b overlapping with the drain electrode layer 120b are formed in a self-aligned manner (see FIG. 15A).

In the oxide semiconductor layer 116 and the oxide semiconductor layer 117 overlapping with the drain electrode layer 119b and the drain electrode layer 120b (and the source electrode layer 119a and the source electrode layer 120a), respectively, the high-resistance drain region 127b and the high-resistance drain region 129b (or the high-resistance source region 127a and the high-resistance source region 129a) are formed, so that reliability can be increased when a circuit is formed. Specifically, the high-resistance drain regions 127b and 129b are formed, whereby a structure can be obtained in which conductivity gradually changes from the drain electrode layers 119b and 120b, the high-resistance drain regions 127b and 129b, to the channel formation regions 126 and 128. Therefore, when the transistor operates with the drain electrode layers 119b and 120b each connected to a wiring that supplies a high power supply potential VDD, the high-resistance drain regions serve as buffers and a high electric field is not applied locally even if a high electric field is applied between the gate electrode layers 103 and 106 and the drain electrode layers 119b and 120b, respectively; thus, the withstand voltage of the transistor can be improved.

In the oxide semiconductor layers overlapping with the drain electrode layer 119b and the drain electrode layer 120b (and the source electrode layer 119a and the source electrode layer 120a), the high-resistance drain region 127b and the high-resistance drain region 129b (or the high-resistance source region 127a and the high-resistance source region 129a) are formed, so that leakage current can be reduced in the channel formation region 126 and the channel formation region 128 in the case where a circuit is formed.

Furthermore, the high-resistance source region or the high-resistance drain region in the oxide semiconductor layer is formed in the entire thickness direction in the case where the thickness of the oxide semiconductor layer is as small as 15 nm or less. In the case where the thickness of the oxide semiconductor layer is as large as 30 nm or more and 50 nm or less, resistance is reduced in part of the oxide semiconductor layer, that is, in a region in contact with the source electrode layer or the drain electrode layer and a periphery thereof thereby forming the high-resistance source region or the high-resistance drain region, and a region in the oxide semiconductor layer that is close to the gate insulating layer can be made to be i-type.

A protective insulating layer 132 may be formed over the insulating layer 125. For example, a silicon nitride film is formed by an RF sputtering method. The RF sputtering method is preferable as a formation method of the protective insulating layer because it achieves high mass productivity. As the protective insulating layer, an inorganic insulating film which does not include impurities such as moisture, a hydrogen ion, and OH− and blocks entry of these from the outside is used: a silicon nitride film, an aluminum nitride film, a silicon nitride oxide film, or an aluminum oxynitride film is used. In this embodiment, the protective insulating layer 132 is formed using a silicon nitride film (see FIG. 15A).

Through the above steps, the transistor 133 in the driver circuit portion, the transistor 134 in the pixel circuit portion, and the capacitor 135 can be manufactured over one substrate. Each of the transistors 133 and 134 is a bottom-gate transistor including an oxide semiconductor layer in which a high-resistance source region, a high-resistance drain region, and a channel formation region are formed: since the high-resistance drain region or the high-resistance source region serves as a buffer, even when a high electric field is applied, the transistors 133 and 134 are prevented from being supplied with a high electric field locally and have improved withstand voltage. Further, formation of the driver circuit portion and the pixel circuit portion over one substrate makes it possible to shorten a connection wiring between the driver circuit and an external signal, leading reduction in size and cost of the semiconductor device (light-emitting device).

The capacitor 135 is formed using the capacitor wiring layer 105 and the capacitor electrode layer 121, in which the gate insulating layer 107 in the capacitor portion is used as a dielectric.

Then, the color filter layer 136 is formed over the protective insulating layer 132. The color filter layer 136 includes a green color filter layer, a blue color filter layer, a red color filter layer, or the like, and a green color filter layer, a blue color filter, and a red color filter layer are sequentially formed. Each color filter layer is formed by a printing method, an inkjet method, an etching method using a photolithography technique, or the like. Accordingly, alignment of the color filter layer 136 and light-emitting region of light-emitting elements can be performed without depending on the attachment accuracy of the sealing substrate. In this embodiment, a photolithography step is performed to form a green color filter layer, a blue color filter layer, and a red color filter layer (see FIG. 15B).

Next, an overcoat layer 137 which covers the color filter layers (the green color filter layer, the blue color filter layer, and the red color filter layer) is formed. The overcoat layer 137 is formed using a light-transmitting resin.

Here, an example in which full color display is performed using three colors of R, G, and B is shown; however, the invention is not particularly limited thereto, and full color display may be performed using four colors of R, G, B, and W.

Next, a protective insulating layer 138 which covers the overcoat layer 137 and the protective insulating layer 132 is formed (see FIG. 15B). For the protective insulating layer 138, an inorganic insulating film such as a silicon nitride film, an aluminum nitride film, a silicon nitride oxide film, or an aluminum oxynitride film is used. It is preferable that the protective insulating layer 138 be an insulating film having the same composition as that of the protective insulating layer 132, in which case they can be etched in one step when a contact hole is formed later.

Figures 16A, 16B:
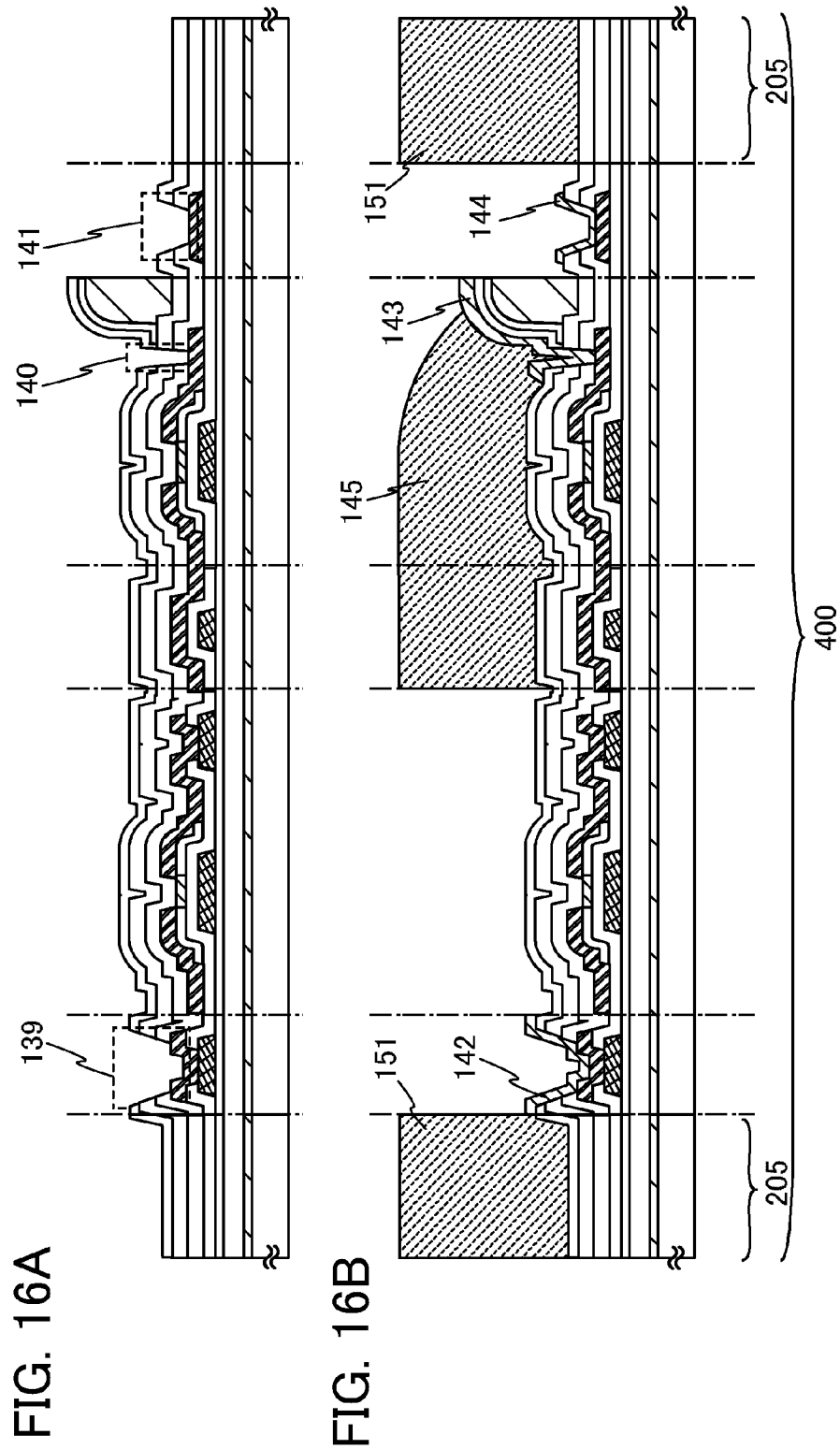
FIGS. 16A and 16B are diagrams showing an embodiment of a method for manufacturing the semiconductor device.

Next, a resist mask is formed by a photolithography step and the protective insulating layer 138, the protective insulating layer 132, and the insulating layer 125 are etched to form the contact hole 140 reaching the drain electrode layer 120b, and then the resist mask is removed (see FIG. 16A). In this etching step, a contact hole 141 reaching the second terminal 123 and a contact hole 139 reaching the connection electrode 122 are also formed. Note that the resist mask for forming the contact holes may be formed by an inkjet method, in which case there is no need to use photomask; thus, manufacturing cost can be reduced.

Next, a light-transmitting conductive film is formed. The light-transmitting conductive film is formed from indium oxide ($In_2O_3$), an alloy of indium oxide and tin oxide ($In_2O_3$—$SnO_2$, abbreviated to ITO), or the like by a sputtering method, a vacuum evaporation method, or the like. Alternatively, an Al—Zn—O-based non-single-crystal film containing nitrogen, a Zn—O-based non-single-crystal film containing nitrogen, or a Sn—Zn—O-based non-single-crystal film containing nitrogen may be used. Note that the composition ratio (atomic %) of zinc in the Al—Zn—O-based non-single-crystal film containing nitrogen is less than or equal to 47 atomic % and is higher than the composition ratio (atomic %) of aluminum in the non-single-crystal film, and the composition ratio (atomic %) of aluminum in the non-single-crystal film is higher than the composition ratio (atomic %) of nitrogen in the non-single-crystal film. Such a material is etched with a hydrochloric acid-based solution. However, since a residue is easily generated particularly in etching of ITO, indium oxide-zinc oxide alloy ($In_2O_3$—$ZnO$) may be used to improve etching processability.

Note that the unit of the composition ratio of components in the light-transmitting conductive film is atomic percent, and the composition ratio is evaluated by analysis using an electron probe X-ray microanalyzer (EPMA).

Next, a photolithography step is performed to form a resist mask, and unnecessary portions of the light-transmitting conductive film are removed by etching, so that the first electrode layer 143, the terminal electrode 142, and the terminal electrode 144 are formed. Then, the resist mask is removed (see FIG. 16B).

Note that the capacitor 135, which includes the gate insulating layer 107 as a dielectric, the capacitor wiring layer 105, and the capacitor electrode layer 121, can be formed over the same substrate as the driver circuit portion and the pixel portion. In the semiconductor device 400, the capacitor electrode layer 121 is part of a power supply line, and the capacitor wiring layer 105 also functions as a part of the gate electrode layer of the driving TFT.

The terminal electrodes 142 and 144 which are formed in the terminal portion function as electrodes or wirings connected to an FPC. The terminal electrode 142 formed over the first terminal 102 with the connection electrode 122 therebetween is a connection terminal electrode serving as an input terminal for the gate wiring. The terminal electrode 144 formed over the second terminal 123 is a connection terminal electrode serving as an input terminal for the source wiring.

Next, a partition 145 is formed so as to cover the periphery of the first electrode layer 143. A crack suppression layer 151 formed of a resin film is formed in a crack suppression region 205 at the same time as the partition 145. The partition 145 and the crack suppression layer 151 formed of a resin film are formed using a film of an organic resin such as polyimide, acrylic, polyamide, or epoxy, an inorganic insulating film, or a siloxane-based resin.

Note that the siloxane-based resin corresponds to a resin containing a Si—O—Si bond formed using a siloxane-based material as a starting material. A siloxane-based resin may contain, as a substituent, an organic group (e.g., an alkyl group, an aryl group, or a fluoro group).

The partition 145 and the crack suppression layer 151 formed of a resin layer can be formed using phosphosilicate glass (PSG), borophosphosilicate glass (BPSG), or the like. Note that the partition 145 may be formed by stacking a plurality of insulating films formed using any of these materials.

There is no particular limitation on the method for forming the partition 145 and the crack suppression layer 151 formed of a resin film: depending on the material, a method such as a sputtering method, an SOG method, a spin coating method, a dipping method, a spray coating method, or a droplet discharge method (e.g., an inkjet method, screen printing, or offset printing), or a means such as a doctor knife, a roll coater, a curtain coater, or a knife coater can be used. Further, other insulating layers used in the semiconductor device (light-emitting device) may be formed using the materials and the methods which are shown as examples of the materials and the methods of the partition 145.

It is particularly preferable that the partition 145 and the crack suppression layer 151 formed of a resin film be formed using a photosensitive resin material to have an opening portion over the first electrode layer 143 so that a sidewall of the opening portion is formed as a tilted surface with continuous curvature. When a photosensitive resin material is used for the partition 145 and the crack suppression layer 151 formed of a resin film, a step of forming a resist mask can be omitted.

The crack suppression layer 151 formed of a resin film needs to have a thickness and a width enough for suppressing progression (growth) of a crack. However, when a width of the crack suppression layer formed of a resin film is increased, the number of desired semiconductor devices manufactured from one substrate might be decreased. Therefore, the crack suppression layer formed of a resin film is formed to have a thickness of greater than or equal to 700 nm and less than or equal to 20000 nm and a width of greater than or equal to 100 μm and less than or equal to 10000 μm.

Through the above steps, the semiconductor device 400 in which the semiconductor element formation process is completed and which includes the crack suppression layer formed of a resin film shown in FIG. 16B can be manufactured.

This embodiment can be implemented in appropriate combination with the structures described in the other embodiments.

Embodiment 3

In this embodiment, a method for manufacturing a semiconductor device which is different from those of the above embodiments will be described with reference to FIGS. 10A to 10C, FIGS. 11A to 11C, FIGS. 12A to 12C, and FIG. 13. In each of Embodiments 1 and 2, a method for manufacturing a display device which is one of semiconductor devices including a transistor included in a driver circuit portion and a pixel circuit portion is described, while in this embodiment, a method for manufacturing a semiconductor integrated circuit chip (also referred to as an IC chip) which is another embodiment of a semiconductor device will be described.

Figure 10A:
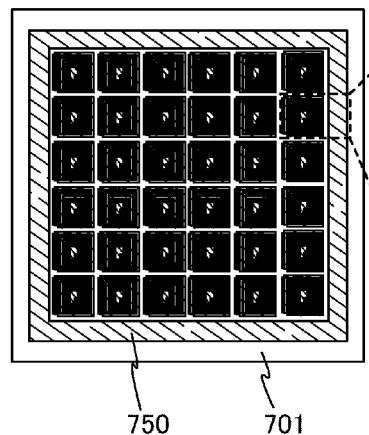
FIGS. 10A to 10C are diagrams showing an embodiment of a semiconductor device.
Figure 10B:
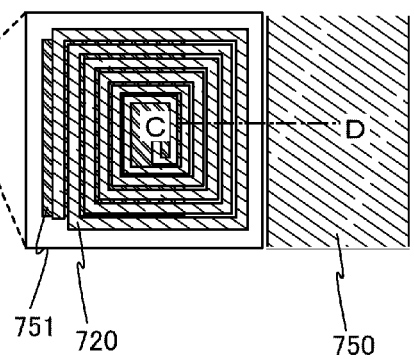
Figure 10C:
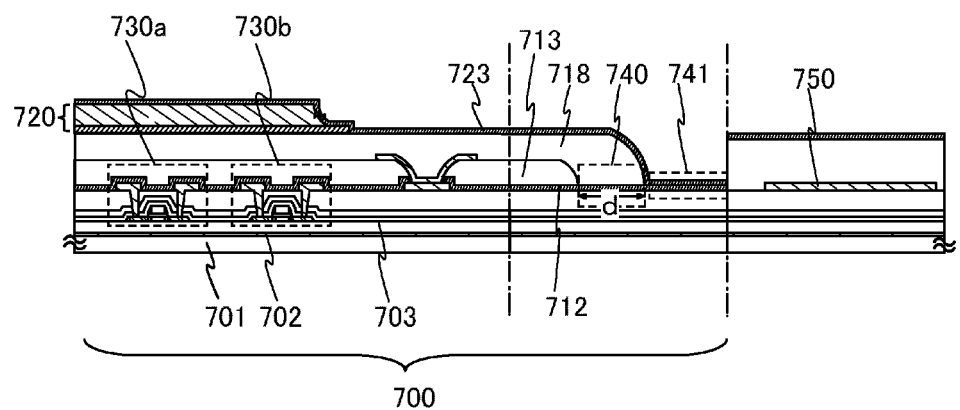

FIG. 10A is a planar view of a semiconductor device. FIG. 10B shows an enlarged planar view of one piece of the semiconductor integrated circuit chip which is the semiconductor device in FIG. 10A. FIG. 10C is a cross-sectional view taken along a broken line C-D in FIG. 10B. Note that FIGS. 10A to 10C are planar views and a cross-sectional view showing a state after a step of forming a semiconductor device is completed and before the semiconductor device is separated from a first substrate.

In FIG. 10A, a plurality of semiconductor integrated circuit chips (hereinafter also referred to as IC chips) which are semiconductor devices is adjacent to each other. A crack suppression layer 750 formed of a metal film is formed in the periphery of the plurality of semiconductor integrated circuits.

In this embodiment, the plurality of IC chips which are semiconductor devices shown in FIG. 10A can be separated from a substrate all together.

As described in this embodiment, the crack suppression layer formed of a metal film can be formed so as to surround a plurality of semiconductor devices. That is, the planar size of the crack suppression layer is not particularly limited and can be changed as appropriate in accordance with the size of the semiconductor device separated from the substrate.

The semiconductor device shown in FIGS. 10A to 10C according to this embodiment includes a separation layer 702 over a substrate 701, a first insulating layer 703 over the separation layer 702, and an integrated circuit 751 over the first insulating layer 703. The integrated circuit 751 includes a transistor 730a and a transistor 730b. In addition, an antenna 720 is provided above the transistor 730a and the transistor 730b, and the transistor 730a is electrically connected to the antenna 720.

An example of a method for manufacturing the semiconductor device 700 in FIG. 10C will be described in detail with reference to FIGS. 11A to 11C, FIGS. 12A to 12C, FIG. 13, and FIGS. 14A and 14B. In the structures described below, the same portions or portions having similar functions are denoted by the same reference numerals in different drawings, and the description thereof will not be repeated.

Figure 11A:
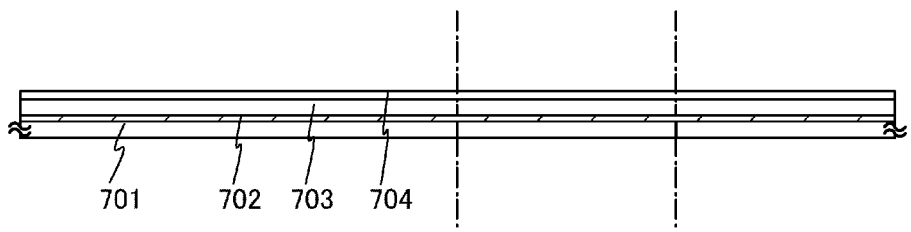
FIGS. 11A to 11C are diagrams showing an embodiment of a method for manufacturing the semiconductor device.
Figure 11B:
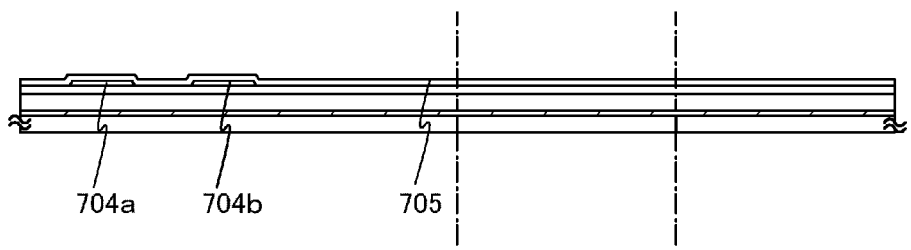

First, the separation layer 702 is formed on a surface of the substrate 701, and then the first insulating layer 703 and a semiconductor layer 704 (for example, a film containing amorphous silicon) are formed (see FIG. 11A). The separation layer 702, the first insulating layer 703, and the semiconductor layer 704 can be successively formed, so that the separation layer 702 and the first insulating layer 703 are not exposed to the air, whereby entry of impurities can be prevented.

Note that the separation layer 702 and the first insulating layer 703 can be formed by methods similar to those of the separation layer 101 and the first insulating layer 111 described in Embodiment 1, respectively.

The semiconductor layer 704 can be formed by a sputtering method, an LPCVD method, a plasma CVD method, or the like. In this embodiment, an amorphous silicon film is formed to have a thickness of 66 nm by a plasma CVD method. Note that when an amorphous silicon film is used for a semiconductor layer, the amorphous silicon film is formed to have a thickness of greater than or equal to 25 nm and less than or equal to 300 nm, preferably greater than or equal to 50 nm and less than or equal to 70 nm.

Next, the semiconductor layer 704 is irradiated with laser light to be crystallized. Note that the semiconductor layer 704 may be crystallized by a method in which laser beam irradiation is combined with a thermal crystallization method using an RTA or an annealing furnace, or a thermal crystallization method using a metal element that promotes crystallization, or the like. After that, the obtained crystal semiconductor film is etched into a desired shape, whereby a semiconductor layer 704a and a semiconductor layer 704b are formed. Then, a gate insulating layer 705 is formed to cover the semiconductor layers 704a and 704b (see FIG. 11B).

An example of a manufacturing process of the semiconductor layers 704a and 704b is briefly described below. First, an amorphous semiconductor film (e.g., an amorphous silicon film) is formed by a plasma CVD method. Next, a solution containing nickel that is a metal element that promotes crystallization is retained on the amorphous semiconductor film, and a dehydrogenation treatment (at 500° C., for one hour) and a thermal crystallization treatment (at 550° C., for four hours) are performed on the amorphous semiconductor film to form a crystalline semiconductor film. Then, the crystal semiconductor film is irradiated with laser light from a laser as needed, depending on the degree of crystallization. Further, the semiconductor layers 704a and 704b are formed by a photolithography method. Note that the thermal crystallization using a metal element that promotes crystallization is not necessarily conducted, and the amorphous semiconductor film may be crystallized only by laser light irradiation.

Alternatively, the semiconductor film may be scanned in one direction for crystallization while being irradiated with a continuous wave laser beam or a laser beam oscillated at a frequency of higher than or equal to 10 MHz, to form the semiconductor layers 704a and 704b. In the case of such crystallization, crystals grow in the scanning direction of the laser light. A transistor may be provided so that its channel length direction (the direction in which carriers flow when a channel formation region is formed) is aligned with the scanning direction.

Next, the gate insulating layer 705 is formed to cover the semiconductor layers 704a and 704b. The gate insulating layer 705 is formed to have a single-layer structure or a stacked-layer structure of a film containing oxide of silicon or nitride of silicon by a plasma CVD method, a sputtering method, or the like. Specifically, the gate insulating layer 705 is formed to have a single-layer structure or a stacked-layer structure of a silicon oxide film, a silicon oxynitride film, or a silicon nitride oxide film.

Alternatively, the gate insulating layer 705 may be formed by oxidizing or nitriding the surfaces of the semiconductor layers 704a and 704b by plasma treatment. For example, the gate insulating layer 705 is formed by plasma treatment with a mixed gas of a rare gas such as He, Ar, Kr, and Xe, and oxygen, nitrogen dioxide ($NO_2$), ammonia, nitrogen, hydrogen, or the like. In that case, plasma is excited by microwaves, so that plasma with a low electron temperature and a high density can be generated. With oxygen radicals (which may include OH radicals in some cases) or nitrogen radicals (which may include NH radicals in some cases) generated by such high-density plasma, the surfaces of the semiconductor layers can be oxidized or nitrided.

By treatment with such high-density plasma, an insulating film having a thickness of approximately greater than or equal to 1 nm and less than or equal to 20 nm, typically greater than or equal to 5 nm and less than or equal to 10 nm, is formed over the semiconductor layers. Since the reaction in this case is a solid-phase reaction, the interface state density between the insulating layer and the semiconductor layers can be controlled extremely low. The semiconductor layers (crystalline silicon or polycrystalline silicon) are directly oxidized (or nitrided) by such plasma treatment, whereby variation in thickness of the formed insulating layer can be considerably reduced. In addition, oxidation does not proceed even at the crystal grain boundaries of crystalline silicon, which makes a very preferable condition. That is, by a solid-phase oxidation of the surfaces of the semiconductor layers by the high-density plasma treatment described herein, a uniform insulating layer with a low interface state density can be formed without causing an excessive oxidation reaction at the crystal grain boundary.

As the gate insulating layer 705, only an insulating layer formed by the plasma treatment may be used or an insulating layer made of silicon oxide, silicon oxynitride, or silicon nitride may be additionally stacked thereover by a CVD method using plasma or thermal reaction. In either case, a transistor is preferably formed to have a gate insulating film, which partly or entirely includes an insulating film formed by plasma treatment because characteristic variations can be reduced.

Further, in the case where the semiconductor layers 704a and 704b are formed in such a manner that a semiconductor film is scanned in one direction for crystallization while being irradiated with a continuous wave laser beam or a laser beam oscillated at a frequency of higher than or equal to 10 MHz, transistors having small characteristic variations and high field effect mobility can be obtained by combining the gate insulating layer subjected to the plasma treatment.

Next, a conductive layer is formed over the gate insulating layer 705. In this embodiment, a conductive layer with a thickness of greater than or equal to 100 nm and less than or equal to 500 nm is formed. Examples of a material which can be used for the conductive layer include a material containing an element selected from aluminum, chromium, tantalum, titanium, molybdenum, tungsten, silver, copper, gold, platinum, nickel, palladium, or the like; an alloy material mainly containing any of these elements; or a compound material mainly containing any of these elements. In the case where the conductive layer has a stacked-layer structure, for example, it is possible to use a stacked-layer structure of a tantalum nitride film and a tungsten film, a stacked-layer structure of a tungsten nitride film and a tungsten film, or a stacked-layer structure of a molybdenum nitride film and a molybdenum film. For example, a stacked-layer structure of a tantalum nitride film having a thickness of 30 nm and a tungsten film having a thickness of 150 nm can be used. Since tungsten or tantalum nitride has high heat resistance, heat treatment aimed at thermal activation can be performed after forming the conductive layer. Further, the conductive layer may have a stacked-layer structure of three or more layers; for example, a stacked-layer structure of a molybdenum film, an aluminum film, and a molybdenum film may be used.

Figure 11C:
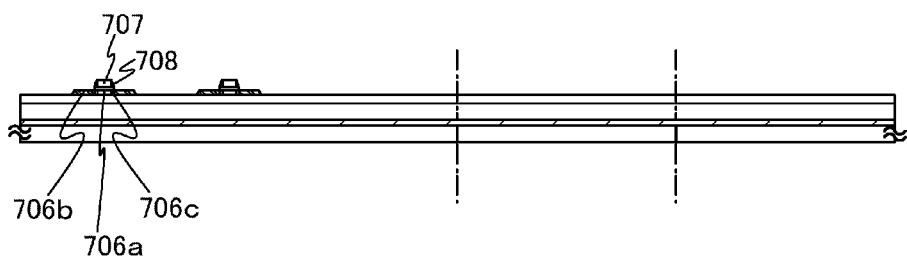

Next, a resist mask is formed over the conductive layer by a photolithography method, and etching treatment for forming a gate electrode and a gate wiring is performed, so that gate electrode layers 707 are formed over the semiconductor layers 704a and 704b (see FIG. 11C).

Then, a resist mask is formed by a photolithography method and an impurity element imparting n-type or p-type conductivity is added to the semiconductor layers 704a and 704b at a low concentration by an ion doping method or an ion implantation method. In this embodiment, an impurity element imparting n-type conductivity is added to the semiconductor layers 704a and 704b at a low concentration. As the impurity element imparting n-type conductivity, an element belonging to Group 15, such as phosphorus (P) or arsenic (As), can be used. As the impurity element imparting p-type conductivity, an element belonging to Group 13, such as boron (B), can be used.

In this embodiment, only n-channel TFTs are used; however, the present invention is not interpreted as being limited thereto. Only p-channel TFTs may be used, or n-channel TFTs and p-channel TFTs may be formed in combination. In the case where n-channel TFTs and p-channel TFTs are formed in combination, an impurity element imparting n-type conductivity is added using a mask covering semiconductor layers that are to be included in p-channel TFTs, and an impurity element imparting p-type conductivity is added using a mask covering semiconductor layers that are to be included in n-channel TFTs, whereby the impurity element imparting n-type conductivity and the impurity element imparting p-type conductivity can be selectively added.

Next, an insulating layer is formed so as to cover the gate insulating layer 705 and the gate electrode layers 707. The insulating layer is formed to have a single-layer structure or a stacked-layer structure of a film containing an inorganic material such as silicon, oxide of silicon, or nitride of silicon, or a film containing an organic material such as an organic resin, which is formed by a plasma CVD method, a sputtering method, or the like. Next, the insulating layer is selectively etched by anisotropic etching mainly in a vertical direction, whereby insulating layers 708 (also referred to as side walls) which are in contact with the side surfaces of the gate electrode layers 707 are formed. The insulating layers 708 are used as masks when an impurity element is added later for forming LDD (lightly doped drain) regions.

Next, by using the resist mask formed by a photolithography method and the gate electrode layers 707 and the insulating layers 708 as masks, an impurity element imparting n-type conductivity is added to the semiconductor layers 704a and 704b. Thus, channel formation regions 706a, first impurity regions 706b, and second impurity regions 706c are formed (see FIG. 11C). The first impurity regions 706b function as source and drain regions of transistors, and the second impurity regions 706c function as LDD regions. The concentration of the impurity element contained in the second impurity regions 706c is lower than that of the impurity element contained in the first impurity regions 706b.

Then, an insulating layer having a single-layer structure or a stacked-layer structure is formed to cover the gate electrode layers 707, the insulating layers 708, and the like. In this embodiment, an example is described in which the insulating layer has a three-layer structure of insulating layers 709, 710, and 711 (see FIG. 12A). These insulating layers can be formed by a plasma CVD method. A silicon oxynitride film having a thickness of 50 nm, a silicon nitride oxide film having a thickness of 200 nm, and a silicon oxynitride film having a thickness of 400 nm can be formed as the insulating layer 709, the insulating layer 710, and the insulating layer 711, respectively. Surfaces of these insulating films are, although depending on the thicknesses, formed along the surface of the layer provided below these insulating films. In other words, since the insulating layer 709 has a small thickness, the surface of the insulating layer 709 closely corresponds to the surfaces of the gate electrode layers 707 and the insulating layer 708. As the thickness of the layer is larger, its surface becomes planar; therefore, the surface of the insulating layer 711 whose thickness is the largest of the three layers is almost planar. However, since the insulating layer 711 is not formed using an organic material, the surface of the insulating layer 711 is not exactly planar. That is, if it is desired that the surface of the insulating layer 711 be planar, an organic material such as polyimide, polyamide, benzocyclobutene, acrylic, or epoxy; a siloxane material; or the like may be used. These insulating layers may be formed by a sputtering method, an SOG method, a droplet discharge method, a screen printing method, or the like in addition to a plasma CVD method.

Then, the insulating layers 709, 710, and 711, and the like are etched using a photolithography method to form contact holes reaching the first impurity regions 706b. Then, conductive layers 731a, 731b, 731c, and 731d functioning as source and drain electrodes of the transistors, a conductive layer 731e functioning as a connecting wiring, and the crack suppression layer 750 formed of a metal film are formed. The conductive layers 731a, 731b, 731c, and 731d can be formed in such a manner: a conductive layer is formed so as to fill the contact holes and then is selectively etched. Note that before the conductive layer is formed, a silicide may be formed over the surfaces of the semiconductor layers 704a and 704b that are exposed by the contact holes to reduce resistance.

The conductive layers 731a, 731b, 731c, and 731d are preferably formed using low-resistance material because delay of signals does not occur. Since a low-resistance material often has low heat resistance, a high heat resistance material is preferably provided over and below the low-resistance material. For example, a structure is preferable in which a film of aluminum, which is a low-resistance material, is formed with a thickness of 300 nm and a film of titanium with a thickness of 100 nm is formed over and below the aluminum film. Further, when the conductive layer 731e functioning as a connecting wiring is formed to have the same stacked-layer structure as the conductive layer 731a, resistance of the connecting wiring can be lowered and heat resistance of the connecting wiring can be improved.

The crack suppression layer 750 formed of a metal film needs to have a thickness with which can maintain mechanical strength. Specifically, the metal conductive film is formed to have a thickness of greater than or equal to 300 nm and less than or equal to 5000 nm, preferably greater than or equal to 500 nm and less than or equal to 1500 nm.

The crack suppression layer 750 formed of a metal film needs to have a width enough for suppressing progression (growth) of a crack. However, when a width of the crack suppression layer is increased, the number of desired semiconductor devices manufactured from one substrate might be decreased. In view of this, the crack suppression layer is formed to have a width of greater than or equal to 100 μm and less than or equal to 10000 μm, preferably greater than or equal to 1000 μm and less than or equal to 5000 μm.

The conductive layer 731a, the conductive layer 731b, the conductive layer 731c, the conductive layer 731d, the conductive layer 731e, and the crack suppression layer 750 can be formed to have a single-layer structure or a stacked-layer structure using another conductive material including an element selected from aluminum, chromium, tantalum, titanium, molybdenum, tungsten, silver, copper, gold, platinum, nickel, and palladium; an alloy material mainly containing any of these elements; or a compound material mainly containing any of these elements. The conductive layer 731a, the conductive layer 731b, the conductive layer 731c, the conductive layer 731d, the conductive layer 731e, and the crack suppression layer 750 can be formed by a sputtering method.

Figure 12A:
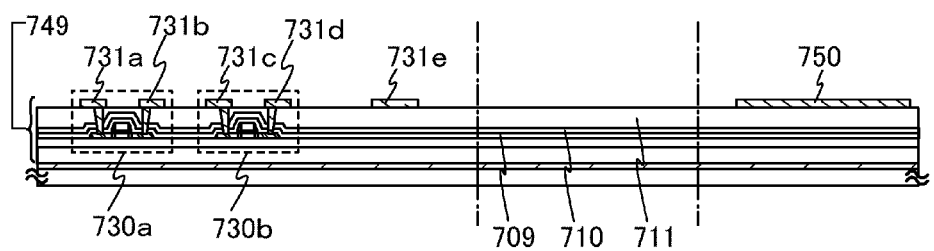
FIGS. 12A to 12C are diagrams showing an embodiment of a method for manufacturing the semiconductor device.

Through the above steps, an element layer 749 including the transistor 730a, the transistor 730b, and the crack suppression layer 750 can be obtained (see FIG. 12A).

Note that heat treatment for repairing crystallinity of the semiconductor layer 704a and the semiconductor layer 704b, activating the impurity element which is added to the semiconductor layer 704a and the semiconductor layer 704b, and hydrogenating the semiconductor layer 704a and the semiconductor layer 704b may be performed before the insulating layers 709, 710, and 711 are formed; after the insulating layer 709 is formed; or after the insulating layers 709 and 710 are formed. The heat treatment may be performed by thermal annealing, laser annealing, RTA, or the like.

Figure 12B:
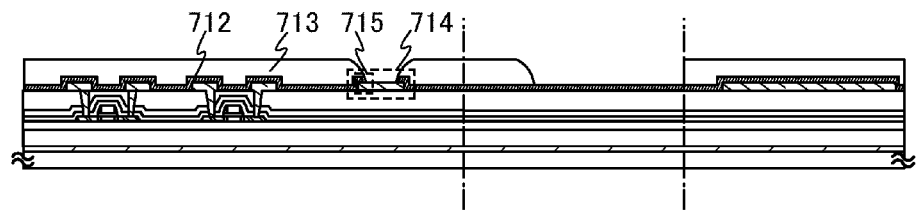

Next, the insulating layer 712 and the insulating layer 713 are formed so as to cover the conductive layer 731a, the conductive layer 731b, the conductive layer 731c, the conductive layer 731d, the conductive layer 731e, and the crack suppression layer 750 (see FIG. 12B). In this embodiment, a 100-nm-thick silicon nitride film is used for the insulating layer 712 and a 1500-nm-thick polyimide film is used for the insulating layer 713. It is preferable that a surface of the insulating layer 713 have high planarity. Accordingly, the planarity of the insulating layer 713 is improved by making the film have a large thickness of, for example, greater than or equal to 750 nm and less than or equal to 3000 nm, in addition to utilizing the characteristics of polyimide, which is an organic material. In addition, an opening portion is formed in the insulating layers 712 and 713. In this embodiment, the case where an opening 714 exposing the conductive layer 731e is formed is described as an example. In the opening 714 (specifically, in a region 715 surrounded by a dotted line), an end portion of the insulating layer 712 is covered with the insulating layer 713. By covering the end portion of the lower insulating layer 712 with the upper insulating layer 713, disconnection of a wiring to be formed later in the opening 714 can be prevented. In this embodiment, since the insulating layer 713 is formed using polyimide which is an organic material, the insulating layer 713 can have a gently tapered shape in the opening 714, and thus disconnection can be efficiently prevented. As a material for the insulating layer 713 with which such an effect of preventing disconnection can be obtained, an organic material such as polyamide, benzocyclobutene, acrylic, or epoxy; a siloxane material; or the like can be given in addition to polyimide. Further, for the insulating layer 712, a silicon oxynitride film or a silicon nitride oxide film may be used instead of the silicon nitride film. The insulating layers 712 and 713 can be manufactured by a plasma CVD method, a sputtering method, an SOG method, a droplet discharge method, a screen printing method, or the like.

Figure 12C:
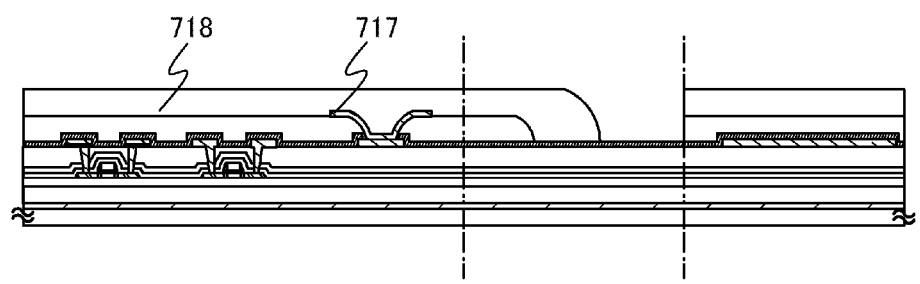

Next, a conductive layer 717 is formed over the insulating layer 712, the insulating layer 713, and the conductive layer 731e, and an insulating layer 718 is formed over the conductive layer 717 (see FIG. 12C). The conductive layer 717 can be formed using the same material as the conductive layers 731a, 731b, 731c, 731d, and 731e and for example, a stacked-layer structure of a 100-nm-thick titanium layer, a 200-nm-thick aluminum layer, and a 100-nm-thick titanium layer can be employed. Since the conductive layer 717 is connected to the conductive layer 731e in the opening 714, the layers formed using titanium are in contact with each other, whereby contact resistance can be suppressed. In addition, since the conductive layer 717 is electrically connected to the transistors and an antenna (formed later), wiring resistance of the conductive layer 717 is preferably low. Therefore, a low-resistance material such as aluminum is preferably used. Since the insulating layer 718 needs to have a planarized surface, it is preferably formed using an organic material, and the case where a 2000-nm-thick polyimide layer is used is described as an example. The insulating layer 718 is formed to have a thickness of 2000 nm, which is larger than the thickness of the insulating layer 713, because unevenness formed by the surfaces in the opening 714 of the insulating layer 713 having a thickness of 1500 nm and the conductive layer 717 formed in the opening 714 should be planarized. Therefore, the insulating layer 718 preferably has a thickness 1.1 to 2 times, further preferably, 1.2 to 1.5 times as large as the thickness of the insulating layer 713. When the insulating layer 713 has a thickness of greater than or equal to 750 nm and less than or equal to 3000 nm, the insulating layer 718 preferably has a thickness of greater than or equal to 900 nm and less than or equal to 4500 nm. The insulating layer 718 is preferably formed using a material with which planarity can be improved in consideration of the thickness of the insulating layer 718. As a material for the insulating layer 718 with which the planarity can be improved, an organic material such as polyamide, benzocyclobutene, acrylic, or epoxy; a siloxane material; or the like can be given in addition to polyimide. In the case where an antenna is formed over the insulating layer 718, as described above, the planarity of the surface of the insulating layer 718 should be taken into consideration.

Figure 13:
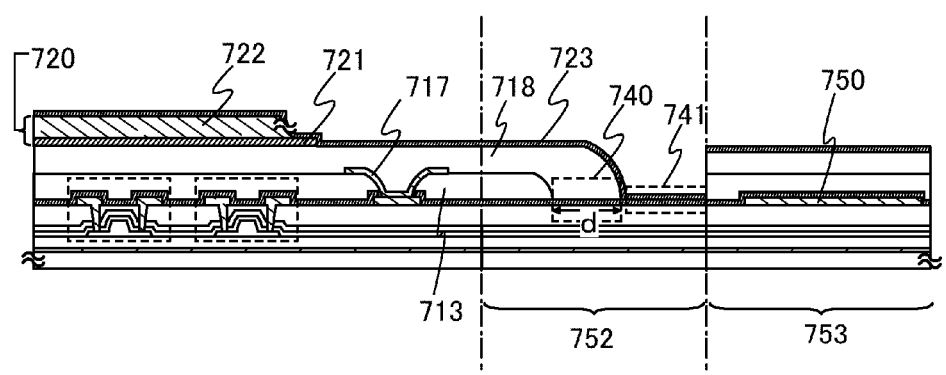
FIG. 13 is a diagram showing an embodiment of a method for manufacturing the semiconductor device.

Next, the antenna 720 is formed over the insulating layer 718 (see FIG. 13). Then, the antenna 720 and the conductive layer 717 are connected to each other through the opening. The opening is provided below the antenna 720 to improve the degree of integration. Note that although the antenna 720 may be directly connected to the conductive layers 731a, provision of the conductive layer 717 as in this embodiment is preferable because a margin can be secured for formation of the opening for connection to the antenna 720, and high integration can be achieved. Therefore, a conductive layer may be further provided over the conductive layer 717 to be connected to the antenna 720. That is, it is acceptable as long as the antenna 720 is electrically connected to the conductive layers 731a included in the transistors, and high integration can be achieved with a connection structure through a plurality of conductive layers. When the thicknesses of the plurality of conductive layers such as the conductive layer 717 are large, the semiconductor device is also thickened; therefore, the thicknesses of the plurality of conductive layers are preferably small. Therefore, the thickness of the conductive layer 717 or the like is preferably smaller than that of the conductive layer 731a.

The antenna 720 can employ a stacked-layer structure of a first conductive layer 721 and a second conductive layer 722. In this embodiment, the case where a stacked-layer structure is formed by using a 100-nm-thick titanium layer for the first conductive layer 721 and a 2000-nm-thick aluminum layer for the second conductive layer 722 is described. Titanium used for the first conductive layer 721 can increase moisture resistance of the antenna, and can increase adhesion between the insulating layer 718 and the antenna 720. In addition, contact resistance between the first conductive layer 721 and the conductive layer 717 can be reduced with the use of titanium. This is because the titanium film formed as the uppermost layer of the conductive layer 717, and the titanium film of the antenna 720, which are in contact with each other, are both formed from titanium. A titanium film which is employed as the first conductive layer 721 is formed by dry etching, so an end portion thereof tends to have a steep angle. Aluminum used for the second conductive layer 722 is a low-resistance material, so it is suitable for the antenna. Formation of the thick second conductive layer 722 makes it possible to lower the resistance. By lowering resistance of the antenna, a communication distance can be increased, which is preferable. Such an aluminum layer is formed by wet etching, so that a side surface of the end portion tends to have a tapered shape. The tapered shape in this embodiment is a shape whose side surface curves toward the inside of the aluminum, that is, a shape having a curved recessed side surface. Since the end portion of the titanium is projected from the end portion of the aluminum, disconnection of an insulating layer which is formed later can be prevented, and further, the durability of the antenna can be increased.

The antenna can be formed by a sputtering method, a printing method such as screen printing or gravure printing, a droplet discharge method, a dispenser method, a plating method, or the like. As a conductive material for the antenna, it is possible to use, in addition to titanium and aluminum, a material containing a metal element such as aluminum, chromium, tantalum, titanium, molybdenum, tungsten, silver, copper, gold, platinum, nickel, or palladium, an alloy containing any of these metal elements, or a compound containing any of these metal elements. Although a stacked-layer structure is described as an example in this embodiment, a single-layer structure of any of the above materials may be employed.

An insulating layer 723 is formed so as to cover the antenna 720. In this embodiment, a 200-nm-thick silicon nitride film is used for the insulating layer 723. Provision of the insulating layer 723 can further increase the moisture resistance of the antenna, which is preferable. Since the end portion of the titanium layer is projected from the end portion of the aluminum layer, the insulating layer 723 can be formed without disconnection. The insulating layer 723 as described above can be formed using a silicon oxynitride film, a silicon nitride oxide film, or another inorganic material in addition to the silicon nitride film.

A periphery portion 752 is shown as an example of a periphery portion of the semiconductor device. In the circuit portion, the insulating layer 718 preferably covers an end portion of the insulating layer 713 outside the antenna (specifically, in a region 740). When the insulating layer 718 covers the insulating layer 713, it is preferable that the end of the insulating layer 718 is located away from the end of the insulating layer 713 by a distance (a distance d) two or more times as large as the total thickness of the insulating layer 713 and the insulating layer 718. In this embodiment, since the insulating layer 713 is formed to have a thickness of 1500 nm and the insulating layer 718 is formed to have a thickness of 2000 nm, the end of the insulating layer 718, which covers the end portion of the insulating layer 713, is away by a distance d of 7000 nm from the end of the insulating layer 713. With such a structure, a margin of a process can be ensured, and further, entry of moisture and oxygen can be prevented.

In addition, the insulating layer 723 and the insulating layer 712 are preferably in contact with each other outside the insulating layer 718, that is, outside the antenna in the circuit portion (specifically, a region 741). In this embodiment, both of the insulating layers 712 and 723 are silicon nitride films, so that the parts formed from the same material are closely in contact with each other; thus, the adhesion is high and entry of moisture and oxygen can be prevented. Further, a silicon nitride film is denser than a silicon oxide film and thus can effectively prevent entry of moisture and oxygen.

In this embodiment, a crack suppression region 753 is formed as a crack suppression layer formed of a metal film in the same step as the formation of the conductive layer 731a, the conductive layer 731b, the conductive layer 731c, and the conductive layer 731d functioning as source electrodes or drain electrodes of the transistors and the conductive layer 731e functioning as a connection wiring. However, without limitation to this, the crack suppression region 753 can be formed in the same step as the formation of the antenna 720 or the conductive layer 717 functioning as a connection electrode.

Through the above steps, the semiconductor device 700 in which a semiconductor element including the crack suppression layer shown in FIG. 10C is formed and the semiconductor element formation process is completed can be manufactured.

This embodiment can be implemented in appropriate combination with the structures described in the other embodiments.

Embodiment 4

An example of another material that can be used for any of the semiconductor layers of the transistors of Embodiments 1 to 3 will be described.

The semiconductor layer included in a semiconductor element can be formed using the following material: an amorphous semiconductor manufactured by a sputtering method or a vapor-phase growth method using a semiconductor material gas such as silane or germane; a polycrystalline semiconductor manufactured by crystallizing the amorphous semiconductor with the use of light energy or thermal energy; a microcrystalline semiconductor; or the like. The semiconductor layer can be formed by a sputtering method, an LPCVD method, a plasma CVD method, or the like.

The microcrystalline semiconductor film can be formed by a high-frequency plasma CVD method with a frequency of higher than or equal to several tens of megahertz and lower than or equal to several hundreds of megahertz or a microwave plasma CVD method with a frequency of higher than 1 GHz. Typically, the microcrystalline semiconductor film can be formed using silicon compound such as $SiH_4$, $Si_2H_6$, $SiH_2Cl_2$, $SiHCl_3$, $SiCl_4$, or $SiF_4$, which is diluted with hydrogen. In addition, the microcrystalline semiconductor film can be formed using the silicon compound that is diluted with hydrogen and one or more rare gas elements selected from helium, argon, krypton, and neon. In that case, the flow ratio of hydrogen to silicon compound is 5:1 to 200:1, preferably 50:1 to 150:1, further preferably 100:1.

A typical example of an amorphous semiconductor is hydrogenated amorphous silicon, and a typical example of a crystalline semiconductor is polysilicon and the like. Polysilicon (polycrystalline silicon) includes so-called high-temperature polysilicon that contains polysilicon formed at a process temperature of higher than 800° C. as its main component, so-called low-temperature polysilicon that contains polysilicon formed at a process temperature of lower than 600° C. as its main component, polysilicon formed by crystallizing amorphous silicon by using an element that promotes crystallization, or the like, and the like. As described above, a microcrystalline semiconductor or a semiconductor partly including a crystalline phase can also be used.

In the case of using a crystalline semiconductor film for the semiconductor layer, the crystalline semiconductor film may be manufactured by various methods (e.g., laser crystallization, thermal crystallization, or thermal crystallization using an element that promotes crystallization such as nickel). Alternatively, a microcrystalline semiconductor, which is an SAS (semi amorphous semiconductor), may be crystallized by laser irradiation to increase crystallinity. In the case where an element that promotes crystallization is not introduced, an amorphous silicon film is heated at 500° C. for one hour in a nitrogen atmosphere before being irradiated with laser light, whereby hydrogen contained in the amorphous silicon film is released to allow its concentration to be $1 \times 10^{20}$ atoms/cm$^3$ or less. This is because, if the amorphous silicon film contains much hydrogen, the amorphous silicon film is broken by laser irradiation.

There is no particular limitation on a method for introducing the metal element into an amorphous semiconductor layer as long as the metal element can exist on the surface of or inside the amorphous semiconductor film; for example, a sputtering method, a CVD method, a plasma processing method (including a plasma CVD method), an adsorption method, or a method of applying a metal-salt solution can be employed. Among them, the method using a solution is easy and advantageous in that the concentration of the metal element can be easily controlled. At this time, an oxide film is preferably formed on the surface of the amorphous semiconductor film by UV light irradiation in an oxygen atmosphere, thermal oxidation, treatment with ozone-containing water or hydrogen peroxide including a hydroxyl radical, or the like in order to improve its wettability and to spread the solution over the entire surface of the amorphous semiconductor film.

In the step of crystallizing the amorphous semiconductor film to form a crystalline semiconductor film, an element that promotes crystallization (also referred to as a catalytic element or a metal element) may be added to the amorphous semiconductor film and heat treatment (at 550° C. to 750° C. for 3 minutes to 24 hours) may be performed for crystallization. As the element that accelerates (promotes) crystallization, it is possible to use one or more kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element that promotes crystallization from the crystalline semiconductor film, a semiconductor film containing an impurity element is formed in contact with the crystalline semiconductor film so as to function as a gettering sink. As the impurity element, an impurity element imparting n-type conductivity, an impurity element imparting p-type conductivity, a rare gas element, or the like can be used. For example, one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor film containing a rare gas element is formed in contact with the crystalline semiconductor film containing the element that promotes crystallization, and then heat treatment is performed (at 550° C. to 750° C. for 3 minutes to 24 hours). The element that promotes crystallization contained in the crystalline semiconductor film moves into the semiconductor film containing a rare gas element and is removed or reduced. After that, the semiconductor film containing a rare gas element, which has functioned as a gettering sink, is removed.

The amorphous semiconductor film may be crystallized by a combination of thermal treatment and laser light irradiation. Alternatively, either thermal treatment or laser light irradiation may be performed plural times.

The crystalline semiconductor film may be formed directly over the substrate by a plasma method. Alternatively, the crystalline semiconductor film may be selectively formed over the substrate by a plasma method.

This embodiment can be implemented in appropriate combination with the structures described in the other embodiments.

This application is based on Japanese Patent Application serial no. 2010-145427 filed with Japan Patent Office on Jun. 25, 2010, the entire contents of which are hereby incorporated by reference.

What is claimed is:

1. A method for manufacturing a semiconductor device comprising the steps of:
   forming an insulating layer over a first substrate;
   forming a pixel circuit portion and a driver circuit portion over the insulating layer, each comprising a transistor including a gate electrode, a source electrode and a drain electrode; and
   forming a layer formed of a metal having a loop shape along a periphery of the first substrate over the insulating layer,
   wherein the layer is formed in the same step as at least one of the gate electrode, the source electrode, and the drain electrode, and
   wherein the layer surrounds the pixel circuit portion and the driver circuit portion.

2. The method for manufacturing a semiconductor device according to claim 1, wherein the layer comprises a material selected from the group consisting of aluminum, chromium, tantalum, titanium, molybdenum, tungsten, silver, copper, gold, platinum, nickel, and palladium.

3. The method for manufacturing a semiconductor device according to claim 1, wherein the layer has a thickness of greater than or equal to 300 nm and less than or equal to 5000 nm.

4. The method for manufacturing a semiconductor device according to claim 1, wherein the layer has a width of greater than or equal to 100 μm and less than or equal to 10000 μm.

5. The method for manufacturing a semiconductor device according to claim 1, wherein the layer is electrically connected to the transistor.

6. The method for manufacturing a semiconductor device according to claim 1, the transistor further comprising;
   a gate insulating layer over the gate electrode; and
   a semiconductor layer over the gate insulating layer,
   wherein the source electrode and the drain electrode are provided over the semiconductor layer.

7. The method for manufacturing a semiconductor device according to claim 1, further comprising the steps of:
   forming a separation layer over the first substrate;
   forming an adhesive layer which is removable by light or heat on a second substrate;
   attaching the first substrate and the second substrate to each other through the adhesive layer after forming the layer;
   separating the first substrate from the pixel circuit portion and the driver circuit portion attached to the second substrate;
   forming a resin layer over a third substrate; and
   attaching the second substrate and the third substrate to each other with the pixel circuit portion, the driver circuit portion, and the resin layer therebetween.

* * * * *